United States Patent
Yang et al.

(10) Patent No.: US 12,190,811 B2
(45) Date of Patent: Jan. 7, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Gansong Yang, Beijing (CN); Yunpeng Zhang, Beijing (CN); Ming Yang, Beijing (CN); Yanhong Ding, Beijing (CN); Ke Liu, Beijing (CN); Miao Liu, Beijing (CN); Xing Yao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/268,361

(22) PCT Filed: Nov. 26, 2021

(86) PCT No.: PCT/CN2021/133446
§ 371 (c)(1),
(2) Date: Jun. 20, 2023

(87) PCT Pub. No.: WO2023/092443
PCT Pub. Date: Jun. 1, 2023

(65) Prior Publication Data
US 2024/0046872 A1 Feb. 8, 2024

(51) Int. Cl.
*G09G 3/3233* (2016.01)
*G09G 3/3266* (2016.01)

(52) U.S. Cl.
CPC ......... *G09G 3/3233* (2013.01); *G09G 3/3266* (2013.01); *G09G 2300/0408* (2013.01);
(Continued)

(58) Field of Classification Search
None
See application file for complete search history.

(56) References Cited

U.S. PATENT DOCUMENTS

| 10,896,642 B1 * | 1/2021 | Qian | G09G 3/3233 |
| 2014/0111490 A1 | 4/2014 | Lee et al. | |

(Continued)

FOREIGN PATENT DOCUMENTS

| CN | 108122542 A | 6/2018 |
| CN | 108564916 A | 9/2018 |

(Continued)

*Primary Examiner* — Nitin Patel
*Assistant Examiner* — Amen W Bogale
(74) *Attorney, Agent, or Firm* — HOUTTEMAN LAW LLC

(57) ABSTRACT

A display substrate is provided to include: a base substrate including a display area and a peripheral area surrounding the display area; pixel units in array are in the display area; a driving module is in the peripheral area and is configured to provide electrical signals for the pixel units, to control the pixel units to operate; the driving module includes driving circuits each provided with a corresponding operating signal line group in the peripheral area; the signal line group includes at least two operating signal lines connected to the corresponding driving circuit, to provide electrical signals thereto; the at least two operating signal lines include first and second clock signal lines; the first clock signal lines for at least two driving circuits are a same first clock signal line; and/or the second clock signal lines for the at least two driving circuits are a same second clock signal line.

16 Claims, 30 Drawing Sheets

(52) U.S. Cl.
CPC ............... *G09G 2300/0426* (2013.01); *G09G 2300/0819* (2013.01); *G09G 2300/0842* (2013.01); *G09G 2310/0281* (2013.01); *G09G 2310/0286* (2013.01); *G09G 2310/08* (2013.01); *G09G 2320/045* (2013.01)

(56) References Cited

U.S. PATENT DOCUMENTS

| | | | |
|---|---|---|---|
| 2018/0151125 A1 | 5/2018 | Lee | |
| 2019/0130842 A1 | 5/2019 | Jang et al. | |
| 2021/0280609 A1* | 9/2021 | An | H01L 27/124 |
| 2021/0407409 A1* | 12/2021 | Zheng | G09G 3/3291 |
| 2022/0114958 A1* | 4/2022 | Feng | H01L 27/1225 |
| 2022/0284861 A1* | 9/2022 | Yang | G09G 3/3266 |

FOREIGN PATENT DOCUMENTS

| | | | |
|---|---|---|---|
| CN | 109767735 A | 5/2019 | |
| CN | 110246454 A | 9/2019 | |
| CN | 110619842 A | 12/2019 | |
| CN | 110880285 A | 3/2020 | |
| CN | 111243523 A | 6/2020 | |
| CN | 112992246 A | 6/2021 | |
| CN | 113012637 A | 6/2021 | |
| CN | 113068415 A | 7/2021 | |
| CN | 113112955 A | 7/2021 | |
| CN | 113284543 A | 8/2021 | |
| CN | 113539197 A | 10/2021 | |
| JP | 2016118664 A | 6/2016 | |

\* cited by examiner

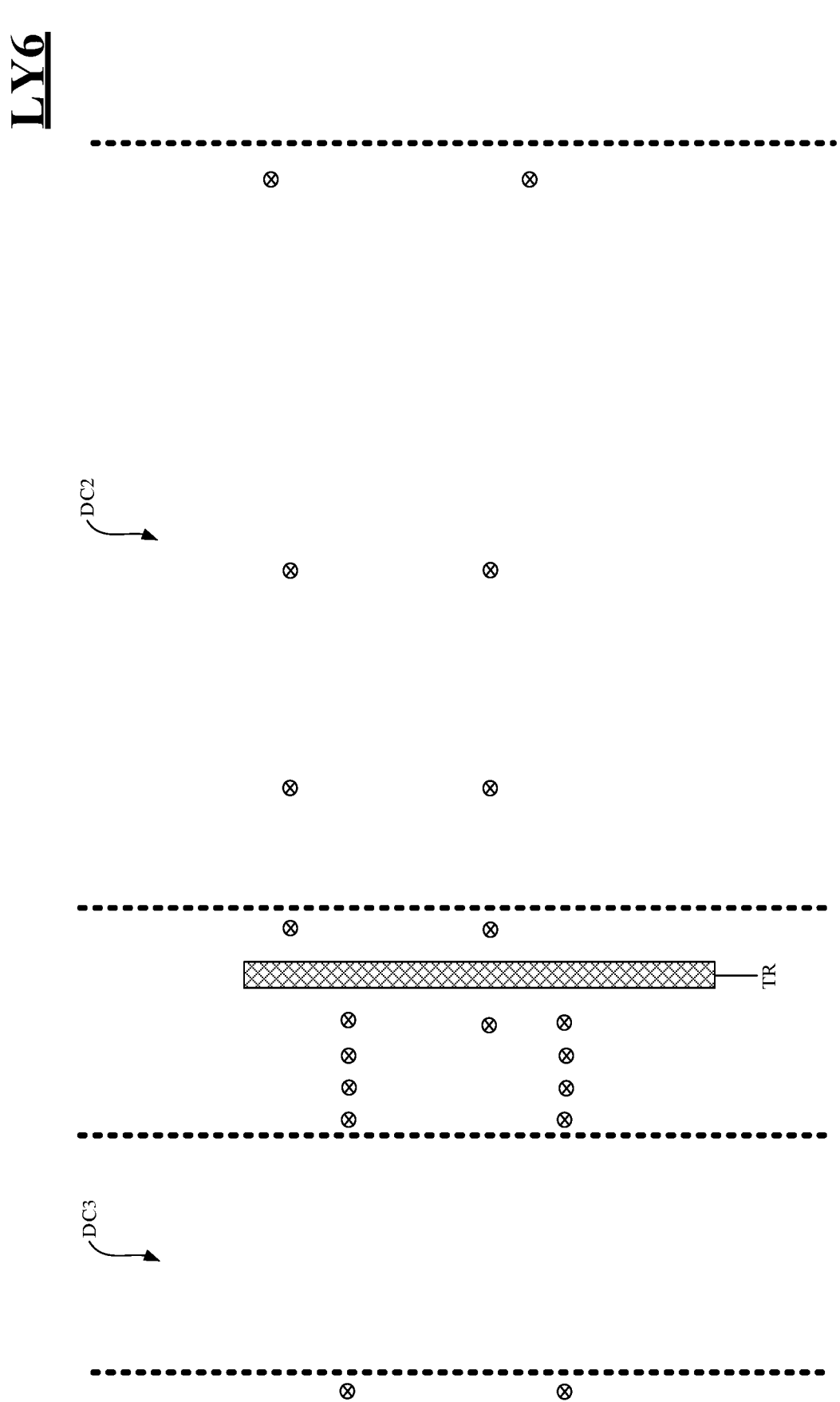

LY8

DC2

DC3

TR

DISPLAY SUBSTRATE AND DISPLAY APPARATUS

TECHNICAL FIELD

The present disclosure relates to the field of display technology, and in particular to a display substrate and a display apparatus.

BACKGROUND

Generally, a display substrate includes a display area and a peripheral area surrounding the display area; a plurality of pixel units arranged in an array are disposed in the display area; a driving module for driving the pixel units is disposed in the peripheral area and includes a plurality of driving circuits; each driving circuit is configured with an independent operating signal line group, and an operating signal line in each operating signal line group is used for providing an electrical signal to a corresponding driving circuit to control the corresponding driving circuit to output.

For example, the driving module includes Q driving circuits, it is necessary to provide Q operating signal line groups in a one-to-one correspondence with the driving circuits. Each driving circuit needs to be operated under the control of at least two different clock signals, so each operating signal line group includes at least two different clock signal lines (a first clock signal line and a second clock signal line). In this case, at least 2Q clock signal lines need to be arranged in the peripheral area. The number of the clock signal lines arranged in the peripheral area is relatively large, so the peripheral area needs to be set to be wider, which is not favorable for realizing a narrow frame.

SUMMARY

In a first aspect, the present disclosure provides a display substrate, including: a base substrate, wherein the base substrate includes a display area and a peripheral area surrounding the display area; a plurality of pixel units are in the display area and in an array; a driving module is in the peripheral area; and the driving module is configured to provide electrical signals for the plurality of pixel units, to control the plurality of pixel units to operate; the driving module includes a plurality of driving circuits; each driving circuit is provided with a corresponding operating signal line group in the peripheral area; the operating signal line group includes at least two operating signal lines, which are connected to the corresponding driving circuit, to provide electrical signals to the corresponding driving circuit; the at least two operating signal lines include a first clock signal line and a second clock signal line; the first clock signal lines for at least two of the plurality of driving circuits are a same first clock signal line; and/or the second clock signal lines provided for the at least two of the plurality of driving circuits are a same second clock signal line.

In some embodiments, all the pixel units are divided into a plurality of pixel unit groups, each of which is provided with a first gate line, a second gate line, and a light emitting control signal line corresponding to the pixel unit group; and pixel units in each pixel unit group are connected to the first gate line, the second gate line, and the light emitting control signal line corresponding to the pixel units; the plurality of driving circuits include: a first gate driving circuit connected to the first gate line to provide a first gate driving signal to the pixel units corresponding to the first gate line through the first gate line, a second gate driving circuit connected to the second gate line to provide a second gate driving signal to the pixel units corresponding to the second gate line through the second gate line, and a light emitting control driving circuit connected to the light emitting control signal line to provide a light emitting control signal to the pixel units corresponding to the light emitting control signal line through the light emitting control signal line; and first clock signal lines for at least two of the first gate driving circuit, the second gate driving circuit and the light emitting control driving circuit are a same first clock signal line and/or second clock signal lines for at least two of the first gate driving circuit, the second gate driving circuit and the light emitting control driving circuit are a same second clock signal line.

In some embodiments, the first gate driving circuit, the second gate driving circuit, and the light emitting control driving circuit are sequentially arranged in a first direction and in a direction away from the display area.

In some embodiments, the first clock signal lines for the second gate driving circuit and the light emitting control driving circuit are a same first clock signal line, and the second clock signal lines for the second gate driving circuit and the light emitting control driving circuit are a same second clock signal line; and the first clock signal line for the first gate driving circuit and the first clock signal line for the second gate driving circuit are two different first clock signal lines, and the second clock signal line for the first gate driving circuit and the second clock signal line for the second gate driving circuit are two different second clock signal lines.

In some embodiments, the first clock signal line shared by the second gate driving circuit and the light emitting control driving circuit is between the second gate driving circuit and the light emitting control driving circuit; and the second clock signal line shared by the second gate driving circuit and the light emitting control driving circuit is between the second gate driving circuit and the light emitting control driving circuit.

In some embodiments, the first clock signal line and the second clock signal line for the first gate driving circuit are both between the first gate driving circuit and the second gate driving circuit.

In some embodiments, the first clock signal line for the first gate driving circuit, the second gate driving circuit, and the light emitting control driving circuit is a same first clock signal line, and the second clock signal line for the first gate driving circuit, the second gate driving circuit, and the light emitting control driving circuit is a same second clock signal line.

In some embodiments, the first clock signal line shared by the first gate driving circuit, the second gate driving circuit, and the light emitting control driving circuit is in an area where the second gate driving circuit is located; and the second clock signal line shared by the first gate driving circuit, the second gate driving circuit and the light emitting control driving circuit is in the area where the second gate driving circuit is located.

In some embodiments, each pixel unit is provided with a corresponding data line, and the first clock signal line and the second clock signal line are in a same layer as the data line; the first clock signal line and the second clock signal line are connected to the corresponding driving circuit through corresponding connecting traces; and the first clock signal line and the second clock signal line extend along a first direction, the connection traces extend along a second direction, and the first direction intersects with the second direction.

In some embodiments, each pixel unit includes: a light emitting device on a side of a layer where the data line is located away from the base substrate; and the light emitting device includes a first electrode, a light emitting layer and a second electrode sequentially arranged along a direction away from the base substrate, and the connecting traces and the first electrode are in a same layer.

In some embodiments, each pixel unit group is further provided with a corresponding first reset signal line; each pixel unit includes: a pixel circuit and a light emitting device, the pixel circuit includes: a first reset circuit, a writing and compensating circuit and a driving transistor; the first reset circuit is connected to a first reset power supply terminal, a control electrode of the driving transistor and the corresponding first reset signal line, and is configured to write a first reset voltage provided by the first reset power supply terminal into the control electrode of the driving transistor in response to control of the first reset signal line; the writing and compensating circuit is connected to a second operating voltage terminal, the control electrode of the driving transistor, a first electrode of the driving transistor, the corresponding data line, the corresponding first gate line, the corresponding second gate line, and the corresponding light emitting control signal line, and is configured to write a data compensation voltage to the control electrode of the driving transistor in response to control of the first gate line and the second gate line, wherein the data compensation voltage is equal to a sum of a data voltage provided by the data line and a threshold voltage of the driving transistor; a second electrode of the driving transistor is connected to a first terminal of the light emitting device, and the driving transistor is configured to output corresponding driving current in response to control of the data compensation voltage; and a second terminal of the light emitting device is connected to the first operating voltage terminal.

In some embodiments, the first reset circuit includes a first transistor, the writing and compensating circuit includes a third transistor, a fourth transistor, and a fifth transistor; a control electrode of the first transistor is connected to the first reset signal line, a first electrode of the first transistor is connected to the first reset power supply terminal, and a second electrode of the first transistor is connected to the control electrode of the driving transistor; a control electrode of the third transistor is connected to the first gate line, a first electrode of the third transistor is connected to the data line, and a second electrode of the third transistor is connected to the first electrode of the driving transistor; a control electrode of the fourth transistor is connected to the light emitting control signal line, a first electrode of the fourth transistor is connected to the second operating voltage terminal, and a second electrode of the fourth transistor is connected to the first electrode of the driving transistor; a control electrode of the fifth transistor is connected to the second gate line, a first electrode of the fifth transistor is connected to the control electrode of the driving transistor, and a second electrode of the fifth transistor is connected to the second electrode of the driving transistor; and wherein the third transistor and the fourth transistor are both P-type transistors, and the fifth transistor is an N-type transistor.

In some embodiments, the first transistor is an N-type transistor, the first reset signal line for the pixel unit group is the second gate line for m pixel unit groups before the pixel unit group, and m is a positive integer.

In some embodiments, the first reset circuit includes a first transistor, and the writing and compensating circuit includes a third transistor, a fourth transistor, a fifth transistor, and a seventh transistor; a control electrode of the first transistor is connected to the first reset signal line, a first electrode of the first transistor is connected to the first reset power supply terminal, and a second electrode of the first transistor is connected to a first electrode of the fifth transistor and a second electrode of the seventh transistor; a control electrode of the third transistor is connected to the first gate line, a first electrode of the third transistor is connected to the data line, and a second electrode of the third transistor is connected to the first electrode of the driving transistor; a control electrode of the fourth transistor is connected to the light emitting control signal line, a first electrode of the fourth transistor is connected to the second operating voltage terminal, and a second electrode of the fourth transistor is connected to the first electrode of the driving transistor; a control electrode of the fifth transistor is connected to the first gate line, and a second electrode of the fifth transistor is connected to the second electrode of the driving transistor; a control electrode of the seventh transistor is connected to the second gate line, and a first electrode of the seventh transistor is connected to the control electrode of the driving transistor; and wherein the third transistor, the fourth transistor and the fifth transistor are all P-type transistors, and the seventh transistor is an N-type transistor.

In some embodiments, the first transistor is a P-type transistor, the first reset signal line for the pixel unit group is the first gate line for n pixel unit groups before the pixel unit group, and n is a positive integer.

In some embodiments, the at least two operating signal lines further include a frame starting signal line; and frame starting signal lines for the second gate driving circuit and the light emitting control driving circuit are a same frame starting signal line.

In some embodiments, the frame starting signal line shared by the second gate driving circuit and the light emitting control driving circuit is between the second gate driving circuit and the light emitting control driving circuit.

In some embodiments, each pixel unit group is further provided with a corresponding second reset signal line; and the pixel circuit further includes: a second transistor; a control electrode of the second transistor is connected to the corresponding second reset signal line, a first electrode of the second transistor is connected to a second reset power supply terminal, and a second electrode of the second transistor is connected to the first terminal of the light emitting device.

In some embodiments, the second transistor is a P-type transistor, the second reset signal line for the pixel unit group is the first gate line for n pixel unit groups before the pixel unit group, and n is a positive integer.

In some embodiments, the pixel circuit further includes: a sixth transistor between the second electrode of the driving transistor and the first terminal of the light emitting device; a control electrode of the sixth transistor is connected to the corresponding light emitting control signal line, a first electrode of the sixth transistor is connected to the second electrode of the driving transistor, and a second electrode of the sixth transistor is connected to the first terminal of the light emitting device; and the sixth transistor is a P-type transistor.

In a second aspect, an embodiment of the present disclosure further provides a display apparatus, including: the display substrate as provided in the first aspect above.

DETAIL DESCRIPTION OF EMBODIMENTS

In order to enable the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are only a few embodiments of the present disclosure, and not all embodiments. The embodiments in the present disclosure and features of the embodiments may be combined with each other without conflict. All other embodiments, which can be derived by one of ordinary skill in the art from the described embodiments of the present disclosure without inventive step, are within the scope of protection of the present disclosure.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. The term "comprising", "including", or the like, means that the element or item preceding the term contains the element or item listed after the term and its equivalent, but does not exclude other elements or items. The term "connected", "coupled", or the like is not limited to a physical or mechanical connection, but may include an electrical connection, whether direct or indirect connections.

In the embodiments of the present disclosure, a transistor used may be a thin film transistor or a field effect transistor or any other device with the same and similar characteristics. A source electrode and a drain electrode of the transistor used are symmetric to each other, so there is no distinction between the source electrode and the drain electrode. In the embodiments of the present disclosure, to distinguish the source electrode from the drain electrode, one electrode is referred to as a first electrode, the other electrode is referred to as a second electrode, and a gate electrode is referred to as a control electrode. The transistor may be an N-type transistor or a P-type transistor according to the characteristics of the transistor. When the P-type transistor is adopted, the first electrode is a drain electrode of the P-type transistor, the second electrode is a source electrode of the P-type transistor, and the opposite is for the N-type transistor.

An "active level" in the present disclosure refers to a level at which a corresponding transistor may be controlled to be turned on; specifically, for the P-type transistor, the corresponding active level is low; for the N-type transistor, the corresponding active level is high.

Figure 1:
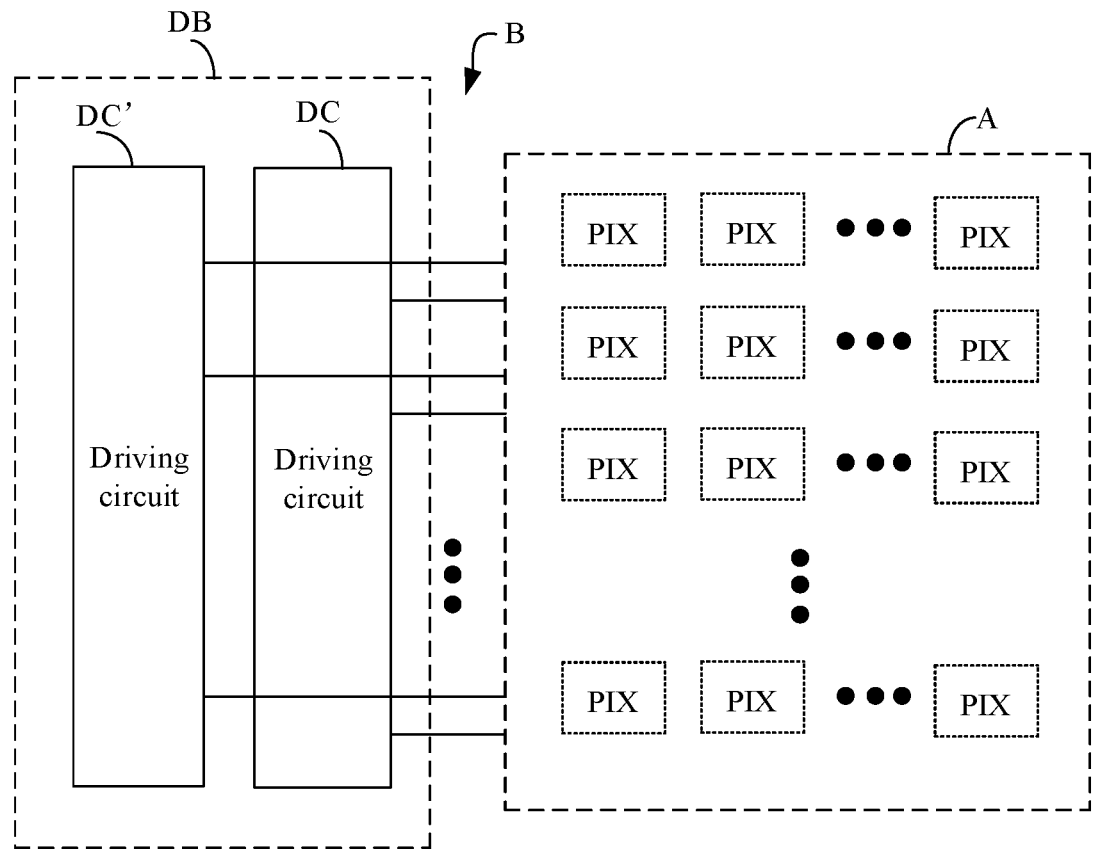
FIG. 1 is a schematic diagram of a structure of a display substrate according to the present disclosure.
Figure 2:
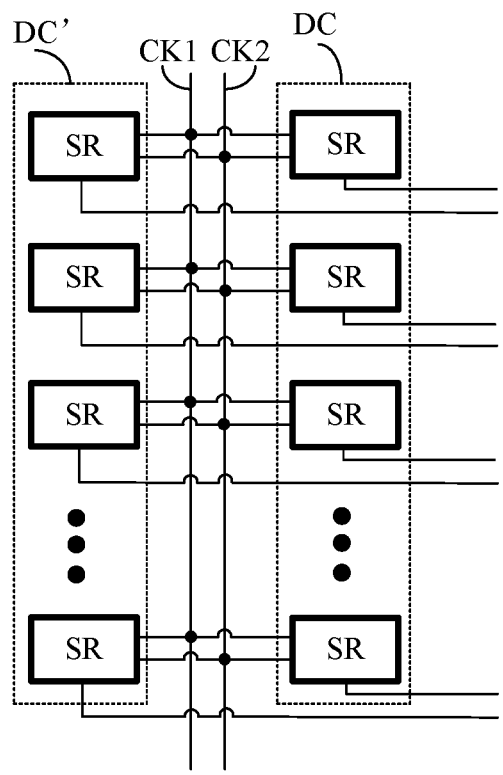
FIG. 2 is a schematic diagram of a structure of a driving module shown in FIG. 1.

FIG. 1 is a schematic diagram of a structure of a display substrate according to the present disclosure; FIG. 2 is a schematic diagram of a structure of a driving module shown in FIG. 1. As shown in FIG. 1, the display substrate includes a base substrate including: a display area A (Active area, which may also be referred to as a display effective area or AA area) and a peripheral area B surrounding the display area A, wherein a plurality of pixel units PIX arranged in an array are disposed in the display area A; and a driving module (or driver block) is disposed in the peripheral area B and is configured to provide electrical signals to the pixel units PIX to control the pixel units PIX to operate, and the driving module includes a plurality of driving circuits DC and DC' to provide a plurality of different electrical signals to the pixel units PIX.

Each pixel unit PIX includes a pixel circuit and a light emitting device. The pixel circuit includes a transistor and a capacitor, generates an electrical signal (i.e., a driving current) by the transistor and the capacitor, and outputs the electrical signal to the light emitting device to drive the light emitting device to emit light. The types and the number of the driving circuits in the driving module are accordingly changed according to different circuit structures of the pixel circuits; the technical solution of the present disclosure does not limit the specific circuit structure of the pixel circuit, and the types and the number of the driving circuits in the driving module.

In the embodiment of the present disclosure, each driving circuit DC, DC' is provided with a corresponding operating signal line group in the peripheral area B. In order to ensure a normal operation of the driving circuit, the operating signal line group includes at least two operating signal lines, which are connected to the corresponding driving circuit DC, DC' to provide electrical signals to the corresponding driving circuit DC, DC'.

The at least two operating signal lines included in the operating signal line group are respectively a first clock signal line and a second clock signal line, which respectively provide a first clock signal and a second clock signal, a duration of the first clock signal in an effective level state is staggered with that of the second clock signal in an effective level state, and the corresponding driving circuit may be controlled to operate based on the first clock signal and the second clock signal.

In the embodiment of the present disclosure, the first clock signal lines provided for the at least two driving circuits are a same first clock signal line CK1; and/or the second clock signal lines provided for the at least two driving circuits are a same second clock signal line CK2. That is, different driving circuits share a same first clock signal line CK1 and/or a same second clock signal line CK2 in the embodiments of the present disclosure.

Each driving circuit DC, DC' includes a plurality of cascaded shift registers SR, the first clock signal line CK1 and the second clock signal line CK2 provided for the driving circuit DC, DC' are connected to the shift registers SR within the driving circuit DC, DC'.

It should be noted that FIG. 1 and FIG. 2 only exemplarily show two driving circuits DC and DC', and FIG. 2 only exemplarily shows that the two driving circuits share the same first clock signal line CK1 and the same second clock signal line CK2, which is only for illustrative purposes, and does not limit the technical solution of the present disclosure.

Compared with the technical solution in the related art where each driving circuit is independently provided with one first clock signal line and one same second clock signal line, in the embodiment of the present disclosure, the different driving circuits share the same first clock signal line and/or the same second clock signal line, so that the total number of clock signal lines required to be provided for the entire driving module can be reduced, that is, the total number of operating signal lines can be reduced; at this time, the width of the peripheral area can be reduced correspondingly, which is beneficial to realizing a narrow frame.

Figure 3:
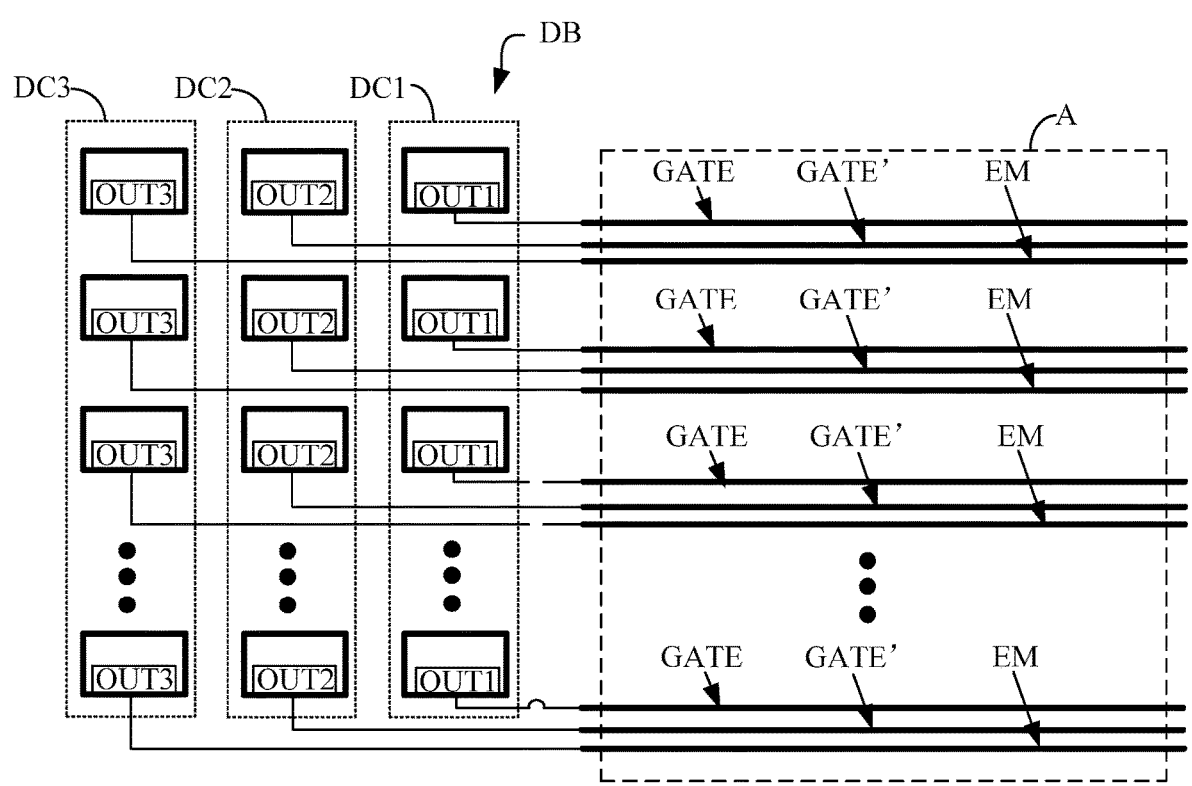
FIG. 3 is a schematic diagram of a structure of a display substrate according to an embodiment of the present disclosure.
Figure 4:
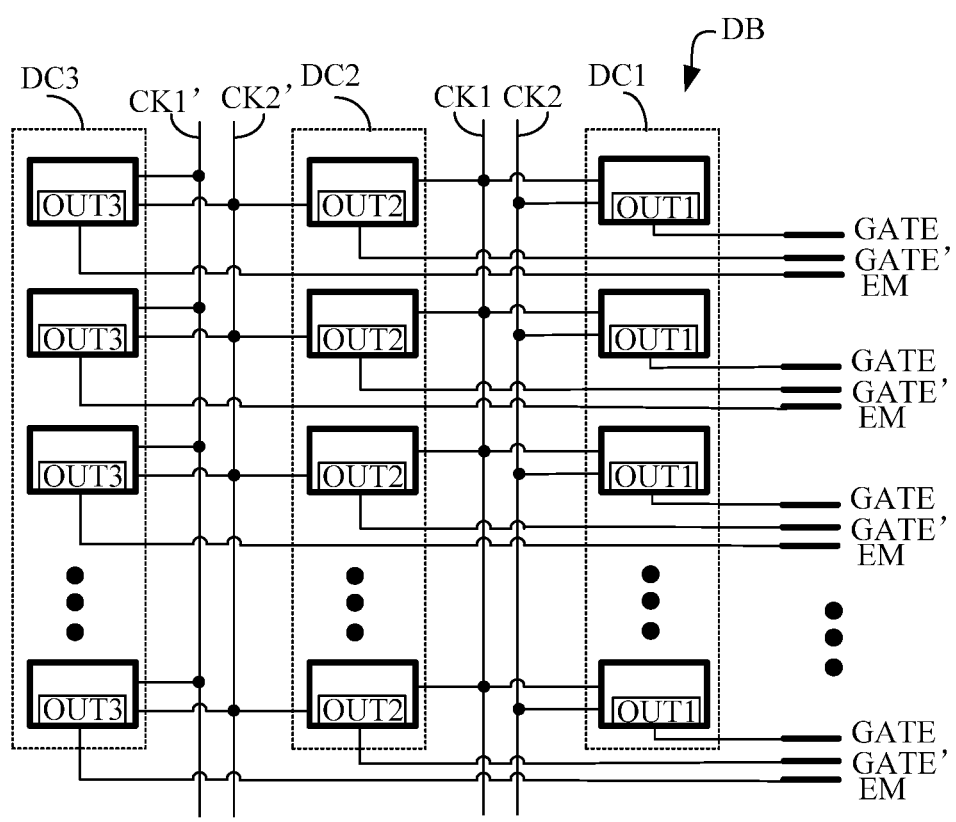
FIG. 4 is a schematic diagram of a structure of a driving module shown in FIG. 3.
Figure 5:
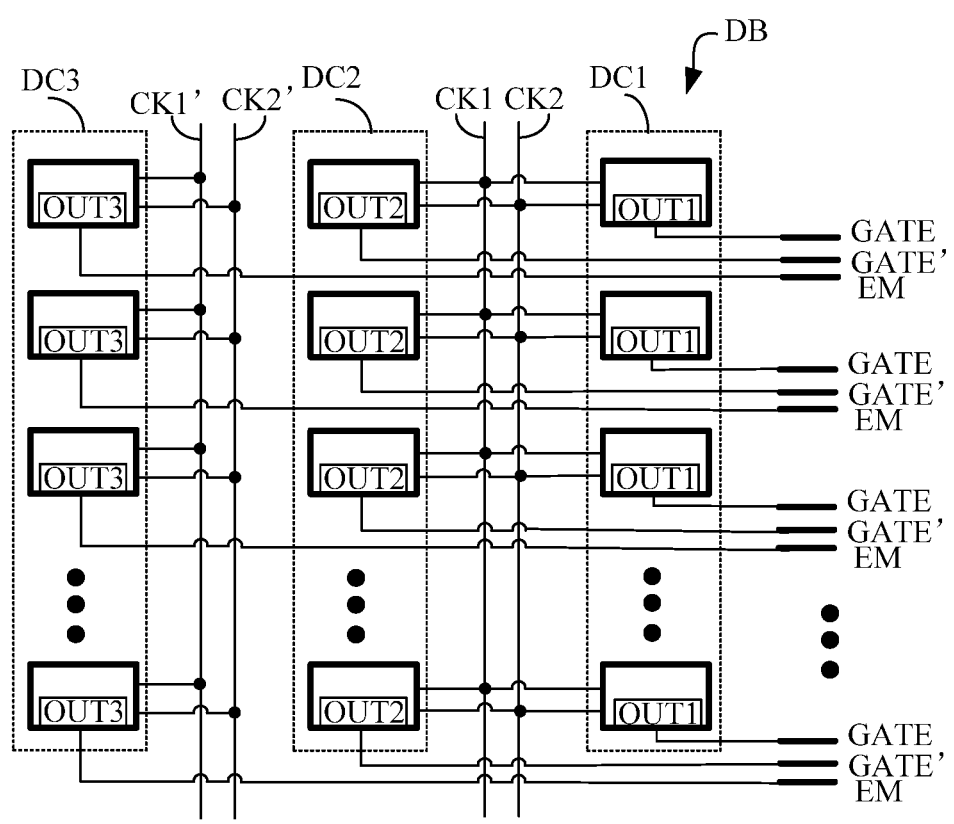
FIG. 5 is a schematic diagram of another structure of a driving module shown in FIG. 3.
Figure 6:
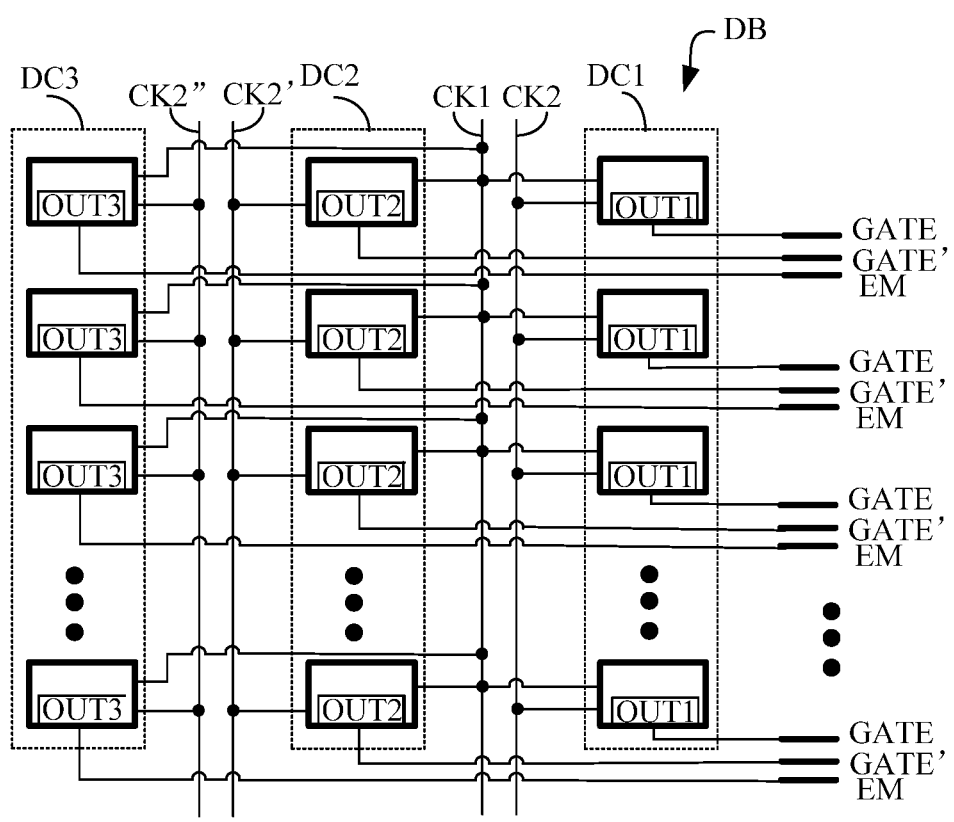
FIG. 6 is a schematic diagram of yet another structure of a driving module shown in FIG. 3.

FIG. 3 is a schematic diagram of a structure of a display substrate according to an embodiment of the present disclosure; FIG. 4 is a schematic diagram of a structure of a driving module shown in FIG. 3; FIG. 5 is a schematic diagram of another structure of a driving module shown in FIG. 3; FIG. 6 is a schematic diagram of yet another structure of a driving module shown in FIG. 3. As shown in FIG. 3 to FIG. 6, in some embodiments, all pixel units are divided into a plurality of pixel unit groups, each of which is provided with a corresponding first gate line GATE, a corresponding second gate line GATE' and a corresponding light emitting control signal line EM, and the pixel units are connected to the corresponding first gate line GATE, the corresponding second gate line GATE' and the corresponding light emitting control signal line EM.

The plurality of driving circuits includes: a first gate driving circuit DC1, a second gate driving circuit DC2, and a light emitting control driving circuit DC3, the first gate driving circuit DC1 is connected to the first gate line GATE to provide a first gate driving signal to the pixel unit through the first gate line GATE, the second gate driving circuit DC2 is connected to the second gate line GATE' to provide a second gate driving signal to the pixel unit through the second gate line GATE', the light emitting control driving circuit DC3 is connected to the light emitting control signal line EM to provide a light emitting control signal to the pixel unit through the light emitting control signal line EM; at least two of the first gate driving circuit DC1, the second gate driving circuit DC2, and the light emitting control driving circuit DC3 are provided with the same first clock signal line, and/or with the same second clock signal line.

It should be noted that FIG. 4 exemplarily shows that the first gate driving circuit DC1 and the second gate driving circuit DC2 share a first clock signal line CK1, the second gate driving circuit DC2 and the light emitting control driving circuit DC3 share a second clock signal line CK2', the first gate driving circuit DC1 is provided with an independent second clock signal line CK2, and the light emitting control driving circuit DC3 is provided with an independent first clock signal line CK1'; FIG. 5 exemplarily shows that the first gate driving circuit DC1 and the second gate driving circuit DC2 share a first clock signal line CK1 and a second clock signal line CK2, and the light emitting control driving circuit DC3 is provided with one independent first clock signal line CK1' and one independent first clock signal line CK2'; FIG. 6 exemplarily shows that the first gate driving circuit DC1, the second gate driving circuit DC2, and the light emitting control driving circuit DC3 share the same first clock signal line CK1, and the first gate driving circuit DC1, the second gate driving circuit DC2, and the light emitting control driving circuit DC3 are each provided with a corresponding one of the second clock signal lines CK2, CK2', CK2". It should be noted that the three cases shown in FIG. 4 to FIG. 6 are only for exemplary purposes, and do not limit the technical solution of the present disclosure. It should be understood by one of ordinary skill in the art that any situation, where the first gate driving circuit DC1, the second gate driving circuit DC2 and the light emitting control driving circuit share the first clock signal line or the second clock signal line, should fall within the protection scope of the present disclosure.

In some embodiments, the first gate driving circuit DC1, the second gate driving circuit DC2, and the light emitting control driving circuit DC3 are sequentially arranged in a first direction (a horizontal direction in the drawings) and in a direction away from the display area.

In some embodiments, each pixel unit includes a pixel circuit and a light emitting device, the pixel circuit is configured to provide a driving current to the light emitting device.

Figure 7:
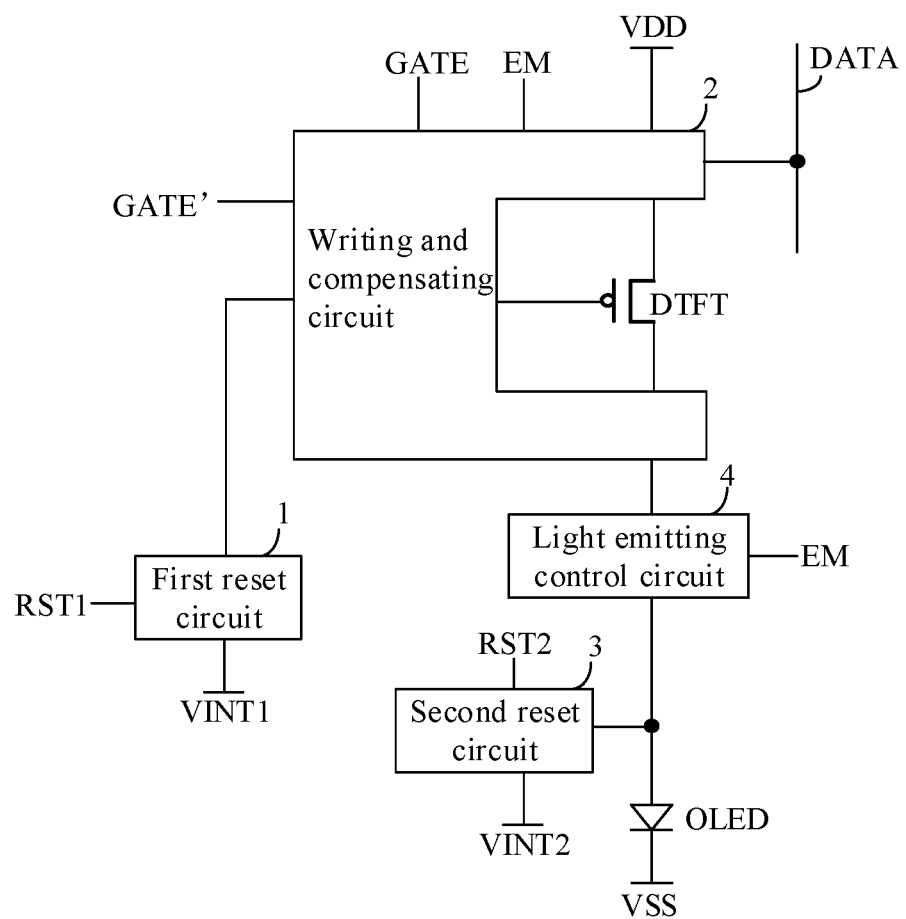
FIG. 7 is a schematic diagram of a circuit structure of a pixel unit according to an embodiment of the present disclosure.

FIG. 7 is a schematic diagram of a circuit structure of a pixel unit according to an embodiment of the present disclosure. As shown in FIG. 7, in some embodiments, each pixel unit includes: a pixel circuit and a light emitting device; the light emitting device in the present disclosure refers to a current-driven light emitting element including an organic light emitting diode (OLED), a light emitting diode (LED), and the like. In the embodiment of the present disclosure, as an example, the light emitting device is an OLED for description, a first terminal and a second terminal of the light emitting device refer to an anode terminal and a cathode terminal, respectively.

The pixel circuit includes: a first reset circuit 1, a writing and compensating circuit 2 and a driving transistor DTFT.

The first reset circuit 1 is connected to a first reset power supply terminal, a control electrode of the driving transistor DTFT, and a corresponding first reset signal line RST1, and is configured to write a first reset voltage VINT1 provided by the first reset power supply terminal to the control electrode of the driving transistor DTFT in response to control of the first reset signal line RST1.

The writing and compensating circuit 2 is connected to a second operating voltage terminal (configured to provide an operating voltage VDD), the control electrode of the driving transistor DTFT, a first electrode of the driving transistor DTFT, a corresponding data line DATA, a corresponding first gate line GATE, a corresponding second gate line GATE', and a corresponding light emitting control signal line EM, and is configured to write a data compensation voltage, which is equal to a sum of a data voltage provided by the data line DATA and a threshold voltage of the driving transistor DTFT, to the control electrode of the driving transistor DTFT in response to control of the first gate line GATE and the second gate line GATE'.

A second electrode of the driving transistor DTFT is connected to a first terminal of the light emitting device OLED, and the driving transistor DTFT is configured to output a corresponding driving current in response to control of the data compensation voltage; a second terminal of the light emitting device OLED is connected to a first operating voltage terminal (configured to provide an operating voltage VSS).

An operation procedure of the pixel circuit shown in FIG. 7 is as follows: in a reset stage, the first reset circuit 1 is configured to write a first reset voltage provided by the first reset power supply terminal to the control electrode of the driving transistor DTFT in response to control of the first reset signal line RST; in a writing and compensating stage, the writing and compensating circuit 2 acquires a data voltage provided by the data line DATA, and writes a data compensation voltage obtained through a threshold voltage compensation to the control electrode of the driving transistor DTFT; in a light emitting stage, the driving transistor DTFT outputs a corresponding driving current in response to control of the data compensation voltage to drive the light emitting device OLED to emit light.

In some embodiments, the pixel circuit further includes a second reset circuit 3 connected to a second reset power supply terminal, the first terminal of the light emitting device OLED, and a corresponding second reset signal line RST2, and configured to write a second reset voltage VINT2 provided by the second reset power supply terminal to the first terminal of the light emitting device OLED in response to control of the second reset signal line RST2, to reset the first terminal of the light emitting device OLED. Specifically, the second reset circuit 3 writes the second reset voltage VINT2 to the first terminal of the light emitting device OLED in the reset stage to reset a voltage at the first terminal of the light emitting device OLED.

In some embodiments, the pixel circuit further includes: a light emitting control circuit 4, the second electrode of the driving transistor DTFT is connected to the first terminal of the light emitting device OLED through the light emitting control circuit 4, the light emitting control circuit 4 is connected to the second electrode of the driving transistor DTFT and the first terminal of the light emitting device OLED, respectively, and the light emitting control circuit 4 is further connected to the light emitting control signal line EM; the light emitting control circuit 4 is configured to control connection/disconnection between the second electrode of the driving transistor DTFT and the first terminal of the light emitting device OLED in response to control of the light emitting control signal line EM. Specifically, the light emitting control circuit 4 disconnects the second electrode of the driving transistor DTFT from the first terminal of the light emitting device OLED in the reset stage and the writing and compensating stage, and connects the second electrode of the driving transistor DTFT with the first terminal of the light emitting device OLED in the light emitting stage.

Figure 8:
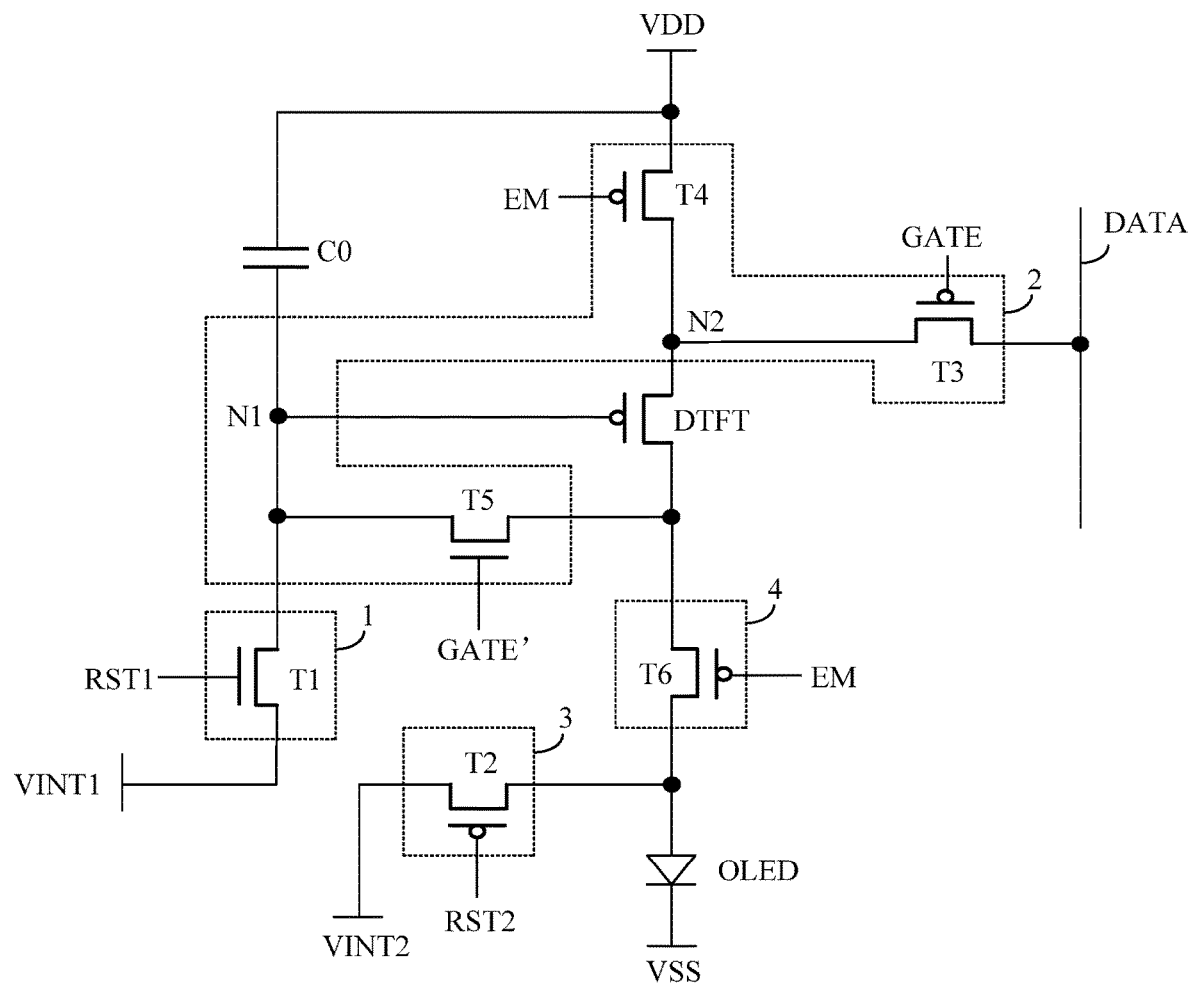
FIG. 8 is a schematic diagram of another circuit structure of a pixel unit according to an embodiment of the present disclosure.

FIG. 8 is a schematic diagram of another circuit structure of a pixel unit according to an embodiment of the present disclosure. As shown in FIG. 8, the pixel circuit shown in FIG. 8 is a specific optional implementation of the pixel unit shown in FIG. 7. In some embodiments, the first reset circuit 1 includes a first transistor T1, and the writing and compensating circuit 2 includes a third transistor T3, a fourth transistor T4, and a fifth transistor T5.

A control electrode of the first transistor T1 is connected to the first reset signal line RST1, a first electrode of the first transistor T1 is connected to the first reset power supply terminal, and a second electrode of the first transistor T1 is connected to the control electrode of the driving transistor DTFT.

A control electrode of the third transistor T3 is connected to the first gate line GATE, a first electrode of the third transistor T3 is connected to the data line DATA, and a second electrode of the third transistor T3 is connected to the first electrode of the driving transistor DTFT.

A control electrode of the fourth transistor T4 is connected to the light emitting control signal line EM, a first electrode of the fourth transistor T4 is connected to the second operating voltage terminal, and a second electrode of the fourth transistor T4 is connected to the first electrode of the driving transistor DTFT.

A control electrode of the fifth transistor T5 is connected to the second gate line GATE', a first electrode of the fifth transistor T5 is connected to the control electrode of the driving transistor DTFT, and a second electrode of the fifth transistor T5 is connected to the second electrode of the driving transistor DTFT.

The third transistor T3 and the fourth transistor T4 are both P-type transistors, and the first transistor T1 and the fifth transistor T5 are N-type transistors.

In some embodiments, a capacitor C0 is disposed between the control electrode of the driving transistor DTFT and the first power supply terminal, and may be used to maintain a voltage at an N1 node stable in the light emitting stage.

When the second reset circuit is included in the pixel circuit, in some embodiments, the second reset circuit 3 includes a second transistor T2, a control electrode of the second transistor T2 is connected to a corresponding second reset signal line RST2, a first electrode of the second transistor T2 is connected to the second reset power supply terminal, and a second electrode of the second transistor T2 is connected to the first terminal of the light emitting device OLED. The second transistor T2 may be an N-type transistor or a P-type transistor. Preferably, the second transistor T2 is a P-type transistor.

When the light emitting control circuit is included in the pixel circuit, in some embodiments, the light emitting control circuit 4 includes: a sixth transistor T6, a control electrode of the sixth transistor T6 is connected to a corresponding light emitting control signal line EM, a first electrode of the sixth transistor T6 is connected to the second electrode of the driving transistor DTFT, and a second electrode of the sixth transistor T6 is connected to the first terminal of the light emitting device OLED; the sixth transistor T6 is a P-type transistor.

In some embodiments, the P-type transistor is a low temperature poly-silicon (LTPS) transistor, which has a good electron mobility, a better response speed, and may be quickly switched between an on state and an off state.

In some embodiments, the N-type transistor is an oxide transistor (e.g., a low temperature poly-oxide transistor), which has a smaller leakage current, and can effectively reduce the leakage current of the transistor in an off state, which is beneficial to maintaining the voltage.

In the embodiment of the present disclosure, the first transistor T1 and the fifth transistor T5 connected to the control electrode of the driving transistor DTFT are designed as N-type transistors, which is beneficial to maintain the voltage at the N1 node stable in the light emitting stage. Accordingly, a duration of the light emitting stage may be increased accordingly, and a brightness refresh frequency of the light emitting device may be designed to be relatively low (e.g., 1 HZ) to accommodate low frequency display scenarios.

Figure 9:
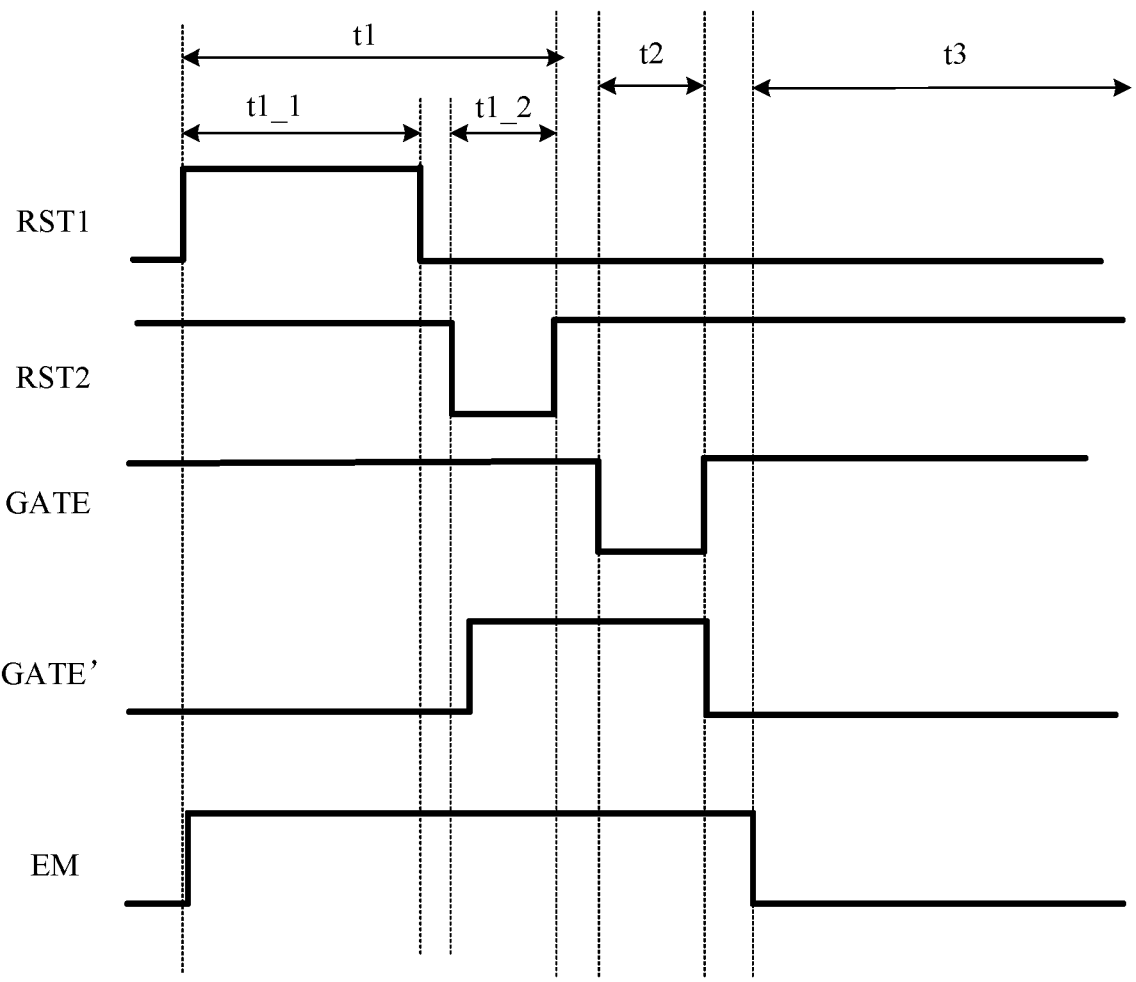
FIG. 9 is a timing diagram illustrating an operation procedure of a pixel unit shown in FIG. 8.

An operation procedure of the pixel unit shown in FIG. 8 is described in detail below by taking the first transistor T1 and the fifth transistor T5 as N-type transistors, and the second transistor T2, the third transistor T3, the fourth transistor T4 and the sixth transistor T6 as P-type transistors as an example. FIG. 9 is a timing diagram illustrating an operation procedure of a pixel unit shown in FIG. 8. As shown in FIG. 9, the operation procedure of the pixel unit includes: a reset stage t1, a data writing and compensating stage t2, and a light emitting stage t3. The reset stage t1 includes a first reset sub-stage t1_1 and a second reset sub-stage t1_2.

In the first reset sub-stage t1_1, the first reset signal line RST1 provides a high level signal, the second reset signal line RST2 provides a high level signal, the first gate line GATE provides a high level signal, the second gate line GATE' provides a low level signal, and the light emitting control signal line EM provides a high level signal. The first transistor T1 is in an on state, and the second to sixth transistors T2 to T6 are all in an off state. Since the first transistor T1 is turned on, the first reset voltage VINT1 may be written to the N1 node through the first transistor T1 to reset a voltage at the control electrode of the driving transistor DTFT.

In the second reset sub-stage t1_2, the first reset signal line RST1 provides a low level signal, the second reset signal line RST2 provides a low level signal, the first gate line GATE provides a high level signal, the second gate line GATE' provides a low level signal and then provides a high level signal, and the light emitting control signal line EM provides a high level signal. The first transistor T1, the third transistor T3, the fourth transistor T4, and the sixth transistor T6 are all turned off, the second transistor T2 is turned on, and the fifth transistor T5 is turned off and then turned on. Since the second transistor T2 is turned on, the second reset voltage VINT2 may be written to the first terminal of the light emitting device OLED through the second transistor T2 to reset the first terminal of the light emitting device OLED.

In the data writing and compensating stage t2, the first reset signal line RST1 provides a low level signal, the second reset signal line RST2 provides a high level signal, the first gate line GATE provides a low level signal, the second gate line GATE' provides a high level signal, and the light emitting control signal line EM provides a high level signal. The first transistor T1, the second transistor T2, the fourth transistor T4, and the sixth transistor T6 are all in an off state, and the third transistor T3 and the fifth transistor T5 are all in an on state. Since the third transistor T3 is turned on, the data voltage Vdata provided by the data line DATA may be written to an N2 node through the third transistor T3; since the fifth transistor T5 is turned on, the driving transistor DTFT outputs a current to charge the N1 node, and when the voltage at the N1 node is charged to Vdata+Vth, the driving transistor DTFT is turned off, and the charging ends; that is, the data compensation voltage is written to the control electrode of the driving transistor DTFT; where Vth is a threshold voltage of the driving transistor DTFT.

It should be noted that in the process of charging the node N1 with the current output by the driving transistor DTFT, since the sixth transistor T6 is turned off, the light emitting device OLED is prevented from emitting light by mistake, so as to improve the display effect. Alternatively, in some embodiments, the sixth transistor T6 may not be omitted.

In the light emitting stage t3, the first reset signal line RST1 provides a low level signal, the second reset signal line RST2 provides a high level signal, the first gate line GATE provides a high level signal, the second gate line GATE' provides a low level signal, and the light emitting control signal line EM provides a high level signal. The first transistor T1, the second transistor T2, the third transistor T3, and the fifth transistor T5 are all in an off state, and the fourth transistor T4 and the sixth transistor T6 are all in an on state. Since the fourth transistor T4 and the sixth transistor T6 are both turned on, the driving transistor DTFT may output a driving current I according to the voltage at the N1 node to drive the light emitting device OLED to emit light.

The following may be derived from a saturation driving current formula of the driving transistor DTFT:

$$I = K*(Vgs - Vth)^2$$
$$= K*(Vdata + Vth - VDD - Vth)^2$$
$$= K*(Vdata - VDD)^2$$

Where K is a constant (its magnitude is related to the electrical characteristics of the driving transistor DTFT), and Vgs is a gate-source voltage of the driving transistor DTFT. As can be seen from the above formula, the driving current of the driving transistor DTFT is only related to the data voltage Vdata and the operating voltage VDD, but is not related to the threshold voltage Vth of the driving transistor DTFT, so that the driving current flowing through the light emitting device is prevented from being affected by the non-uniformity and drift of the threshold voltage, and the uniformity of the driving current flowing through the light emitting device is effectively improved.

In some embodiments, a pulse width of the electrical signal loaded in the first reset signal line RST1 is the same as that of the electrical signal loaded in the second gate line GATE' by design, and the first reset signal line RST1 provided for the pixel unit group is the second gate line GATE' provided for m pixel unit groups before the pixel unit group, where m is a positive integer; wherein a value of m is not too large, for example, the value of m is 1 or 2. In the embodiment of the present disclosure, by using the second gate line GATE' as the first reset signal line RST1, it is unnecessary to additionally provide an independent first reset signal line RST1 in the display area, and additionally provide an independent driving circuit for the first reset signal line RST1 in the peripheral area.

In some embodiments, a pulse width of the electrical signal loaded in the second reset signal line RST2 is the same as that of the electrical signal loaded in the first gate line GATE by design, and the second reset signal line RST2 provided for the pixel unit group is the first gate line GATE provided for n pixel unit groups before the pixel unit group, where n is a positive integer; wherein a value of n is not too large, for example, the value of n is 1 or 2. In the embodiment of the present disclosure, by using the first gate line GATE as the second reset signal line RST2, it is unnecessary to additionally provide an independent second reset signal line RST2 in the display area, and additionally provide an independent driving circuit for the second reset signal line RST2 in the peripheral area.

Based on the above, five control signals are required for the driving process of the pixel unit, but only three types of signal lines, i.e., the first gate line GATE, the second gate line GATE' and the light emitting control signal line EM, need to be arranged in the display area by multiplexing the signal lines; accordingly, only three driving circuits, i.e., the first gate driving circuit DC1, the second gate driving circuit DC2, and the light emitting control driving circuit DC3, need to be arranged in the peripheral area.

Figure 10:
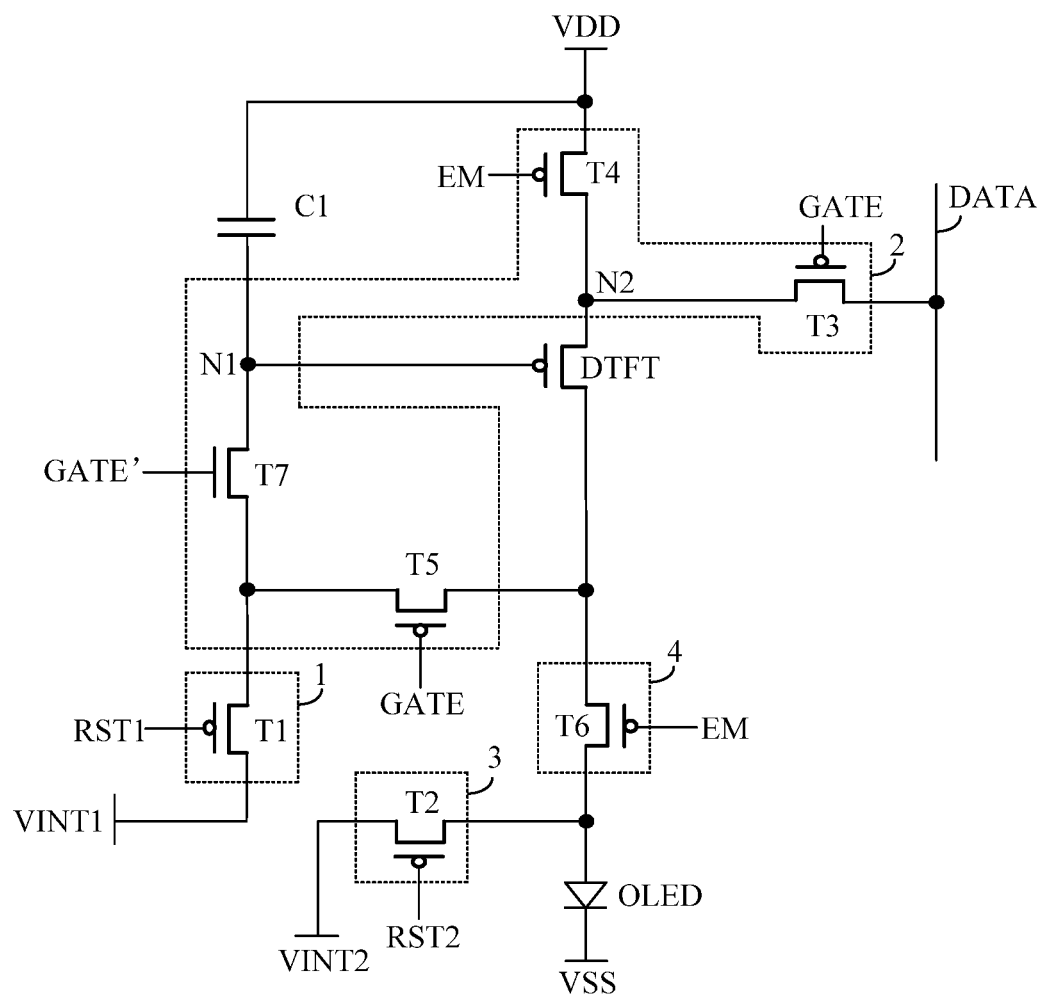
FIG. 10 is a schematic diagram of another circuit structure of a pixel unit according to an embodiment of the present disclosure.

FIG. 10 is a schematic diagram of another circuit structure of a pixel unit according to an embodiment of the present disclosure. As shown in FIG. 10, the pixel circuit shown in FIG. 10 is a specific optional implementation of the pixel unit shown in FIG. 7. Unlike the pixel unit shown in FIG. 8, the writing and compensating circuit in FIG. 10 includes a third transistor T3, a fourth transistor T4, a fifth transistor T5, and a seventh transistor T7.

A control electrode of the third transistor T3 is connected to the first gate line GATE, a first electrode of the third transistor T3 is connected to the data line DATA, and a second electrode of the third transistor T3 is connected to the first electrode of the driving transistor DTFT.

A control electrode of the fourth transistor T4 is connected to the light emitting control signal line EM, a first electrode of the fourth transistor T4 is connected to the second operating voltage terminal, and a second electrode of the fourth transistor T4 is connected to the first electrode of the driving transistor DTFT.

A control electrode of the fifth transistor T5 is connected to the first gate line GATE, a first electrode of the fifth transistor T5 is connected to a second electrode of the seventh transistor T7, and a second electrode of the fifth transistor T5 is connected to the second electrode of the driving transistor DTFT.

A control electrode of the seventh transistor T7 is connected to the second gate line GATE', a first electrode of the seventh transistor T7 is connected to the control electrode of the driving transistor DTFT, and a second electrode of the seventh transistor T7 is connected to the first reset circuit 1.

Specific structures of the first reset circuit 1, the second reset circuit 3, and the light emitting control circuit 4 are shown in FIG. 8.

In some embodiments, the seventh transistor T7 connected to the control electrode of the driving transistor DTFT is an N-type transistor, which is beneficial to maintain the voltage at the N1 node stable in the light emitting stage; the other transistors in the pixel unit except for the seventh transistor T7 are P-type transistors, so that the pixel unit as a whole has a better response speed.

Figure 11:
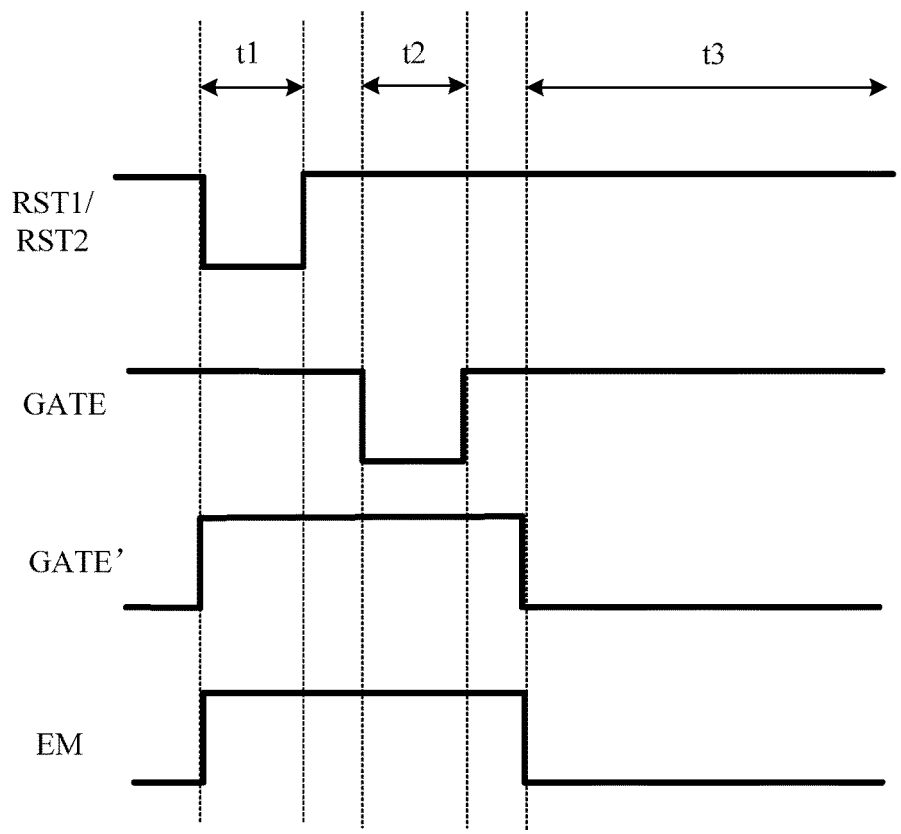
FIG. 11 is a timing diagram illustrating an operation procedure of a pixel unit shown in FIG. 10.

An operation procedure of the pixel unit shown in FIG. 10 is described in detail below by taking the seventh transistor T7 as N-type transistors, and the first to sixth transistors T1 to T6 as P-type transistors as an example. FIG. 11 is a timing diagram illustrating an operation procedure of a pixel unit shown in FIG. 10. As shown in FIG. 10, the operation procedure of the pixel circuit includes: a reset stage t1, a data writing and compensating stage t2, and a light emitting stage t3.

In the reset stage t1, the first reset signal line RST1 and the second reset signal line RST2 each provide a low level signal, the first gate line GATE provides a high level signal, the second gate line GATE' provides a high level signal, and the light emitting control signal line EM provides a high level signal. The first transistor T1, the second transistor T2, and the seventh transistor T7 are all in an on state, and the third to sixth transistors T3 to T6 are all in an off state. Since both the first transistor T1 and the seventh transistor T7 are turned on, the first reset voltage VINT1 may be written to the N1 node through the first transistor T1 and the seventh transistor T7 to reset the voltage at the control electrode of the driving transistor DTFT. Since the second transistor T2 is turned on, the second reset voltage VINT2 may be written to the first terminal of the light emitting device through the second transistor T2 to reset the first terminal of the light emitting device.

In the data writing and compensating stage t2, the first reset signal line RST1 and the second reset signal line RST2 each provide a high level signal, the first gate line GATE provides a low level signal, the second gate line GATE' provides a high level signal, and the light emitting control signal line EM provides a high level signal. The first transistor T1, the second transistor T2, the fourth transistor T4, and the sixth transistor T6 are all in an off state, and the third transistor T3, the fifth transistor T5, and the seventh transistor T7 are all in an on state. Since the third transistor T3 is turned on, the data voltage Vdata provided by the data line may be written to the N2 node through the third transistor T3; since the fifth transistor T5 and the seventh transistor T7 are turned on, the driving transistor DTFT outputs a current to charge the N1 node, and the driving transistor DTFT is turned off when the voltage at the N1 node is charged to Vdata+Vth, and the charging ends; that is, the data compensation voltage is written to the control electrode of the driving transistor DTFT; where Vth is the threshold voltage of the driving transistor DTFT.

In the light emitting stage t3, the first reset signal line RST1 and the second reset signal line RST2 each provide a high level signal, the first gate line GATE provides a high level signal, the second gate line GATE' provides a low level signal, and the light emitting control signal line EM provides a low level signal. The first transistor T1, the second transistor T2, the third transistor T3, the fifth transistor T5, and the seventh transistor T7 are all in an off state, and the fourth transistor T4 and the sixth transistor T6 are all in an on state. Since both the fourth transistor T4 and the sixth transistor T6 are turned on, the driving transistor DTFT may output a driving current I according to the voltage at the N1 node to drive the light emitting device OLED to emit light.

In some embodiments, a pulse width of the electrical signal loaded in each of the first reset signal line RST1 and the second reset signal line RST2 is the same as that of the electrical signal loaded in the first gate line GATE by design, and each of the first reset signal line RST1 and the second reset signal line RST2 provided for the pixel unit group is the first gate line GATE provided for n pixel unit groups before the pixel unit group, where n is a positive integer; wherein a value of n is not too large, for example, the value of n is 1 or 2. In the embodiment of the present disclosure, by using the first gate line GATE as each of the first reset signal line RST1 and the second reset signal line RST2, it is unnecessary to additionally provide an independent first reset signal line RST1 and an independent second reset signal line RST2 in the display area, and additionally provide an independent driving circuit for each of the first reset signal line RST1 and the second reset signal line RST2 in the peripheral area.

Based on the above, five control signals are required for the driving process of the pixel unit, but only three types of signal lines, i.e., the first gate line GATE, the second gate line GATE' and the light emitting control signal line EM, need to be arranged in the display area by multiplexing the signal lines; accordingly, only three driving circuits, i.e., the first gate driving circuit DC1, the second gate driving circuit DC2, and the light emitting control driving circuit DC3, need to be arranged in the peripheral area.

It should be noted that the case where the pixel unit has the structure shown in FIG. 8 or FIG. 10 is only an optional implementation in the embodiment of the present disclosure, and does not limit the technical solution of the present disclosure. In addition, the case that the pixel unit shown in FIG. 8 adopts the operation timing shown in FIG. 9, and the case that the pixel unit shown in FIG. 10 adopts the operation timing shown in FIG. 11 are all optional implementations in the embodiment of the present disclosure, and do not limit the technical solution of the present disclosure.

In the embodiment of the present disclosure, the first gate driving circuit DC1 includes a plurality of cascaded first shift registers, each of which is provided with a first signal output terminal OUT1 connected to a corresponding one of the first gate lines GATE; the second gate driving circuit DC2 includes a plurality of cascaded second shift registers, each of which is provided with a second signal output terminal OUT2 connected to a corresponding one of the second gate lines GATE'; the third gate driving circuit includes a plurality of cascaded third shift registers, each of which is provided with a third signal output terminal OUT3 connected to a corresponding one of the light emitting control signal lines EM.

The operating signal group provided for each driving circuit also includes a frame starting signal line, and a signal input terminal of the shift register at the 1st stage in each driving circuit is connected to one corresponding frame starting signal line; a signal input terminal of each of the shift registers at the 2nd stage to at the last stage is connected to the signal output terminal of the shift register of the respective previous stage.

Figure 12:
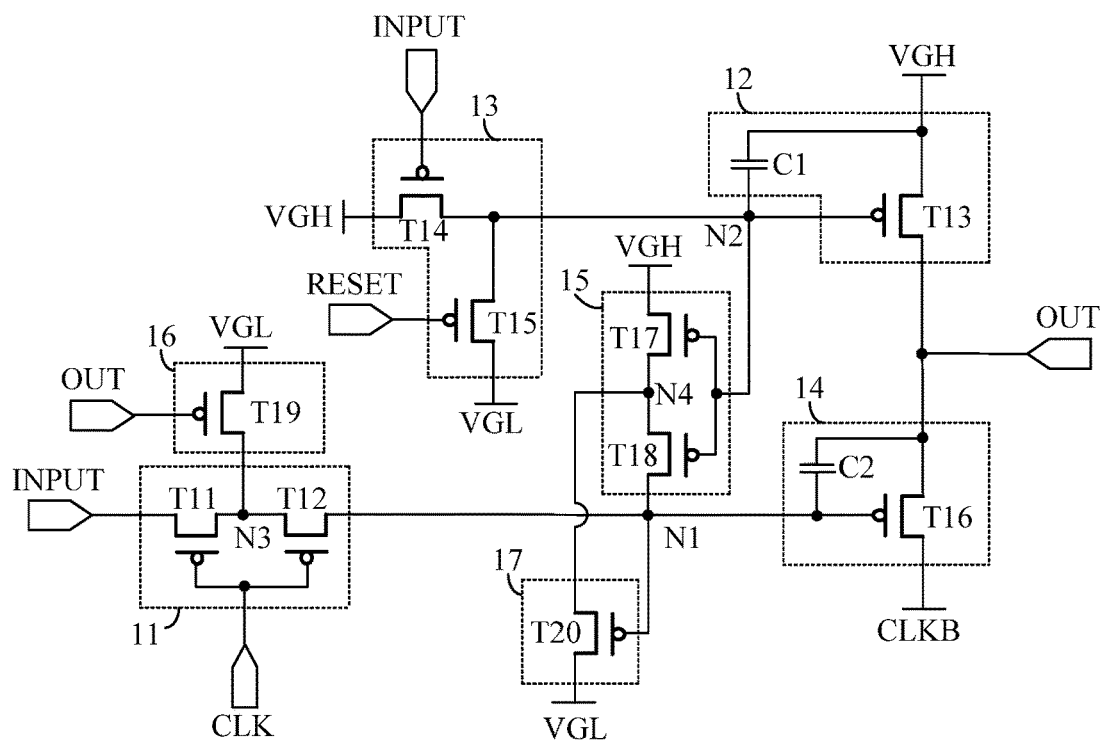
FIG. 12 is a schematic diagram of a circuit structure of a first shift register according to an embodiment of the present disclosure.

FIG. 12 is a diagram of a circuit structure of a first shift register according to an embodiment of the present disclosure. As shown in FIG. 12, the first shift register includes: a first input circuit 11, a pull-up output circuit 12, a pull-up control circuit 13, a pull-down output circuit 14, a first pull-down control circuit 15, a first noise reduction circuit 16, and a second noise reduction circuit 17.

The first input circuit 11 has a first terminal connected to an input terminal INPUT of the first shift register and configured to receive an input signal from the input terminal INPUT, a second terminal connected to a first clock signal terminal CLK, and a third terminal connected to a first node N1. The first input circuit 11 is configured to transmit the received input signal to the first node N1 under control of a first clock signal at the first clock signal terminal CLK.

A first terminal of the pull-up output circuit 12 is connected to the first operating voltage terminal (providing the voltage VGH), a second terminal of the pull-up output circuit 12 is connected to a second node N2, and a third terminal of the pull-up output circuit 12 is connected to the output terminal OUT of the first shift register. The pull-up output circuit 12 is configured to provide the voltage VGH at the first operating voltage terminal to the output terminal OUT under control of the voltage at the second node N2.

A first terminal of the pull-up control circuit 13 is connected to a reset terminal RESET, a second terminal of the pull-up control circuit 13 is connected to the first operating voltage terminal, a third terminal of the pull-up control circuit 13 is connected to the second node N2, a fourth terminal of the pull-up control circuit 13 is connected to the input terminal INPUT, and a fifth terminal of the pull-up control circuit 13 is connected to the second operating voltage terminal (for providing the second voltage VGL). The pull-up control circuit 13 is configured to provide a voltage at the first operating voltage terminal to the second node N2 under control of an input signal or provide the voltage VGL at the second operating voltage terminal to the second node N2 under control of a reset signal from the second clock signal terminal.

The pull-down output circuit 14 has a first terminal connected to the first node N1, a second terminal connected to the second clock signal terminal CLKB, and a third terminal connected to the output terminal OUT. The pull-down output circuit 14 is configured to provide a second clock signal from the second clock signal terminal CLKB to the output terminal OUT under control of a voltage at the first node N1.

A first terminal of the first pull-down control circuit 15 is connected to the first operating voltage terminal, a second terminal of the first pull-down control circuit 15 is connected to the first node N1, and a third terminal of the first pull-down control circuit 15 is connected to the second node N2. The first pull-down control circuit 15 is configured to provide the voltage at the first operating voltage terminal to the first node N1 under control of the voltage at the second node N2.

The first noise reduction circuit 16 has a first terminal connected to the second clock signal terminal CLKB, a second terminal connected to the output terminal OUT, and a third terminal connected to a third node N3. The first noise reduction circuit 16 is configured to reduce a leakage of the first node N1 from the first input circuit 11 by adjusting a voltage at the third node N3.

A first terminal of the second noise reduction circuit 17 is connected to a fourth node N4, a second terminal of the second noise reduction circuit 17 is connected to the first node N1, and a third terminal of the second noise reduction circuit 17 is connected to the second operating voltage terminal. The second noise reduction circuit 17 is configured to reduce a leakage of the first node N1 from the first pull-down control circuit 15 by adjusting a voltage at the fourth node N4.

The third node N3 is a connection point between the first noise reduction circuit 16 and the first input circuit 11, and the fourth node N4 is a connection point between the second noise reduction circuit 17 and the first pull-down control circuit 15.

The first noise reduction circuit 16 and the second noise reduction circuit 17 reduce the leakage of the first node N1 from the first input circuit 11 and the first pull-down control circuit 15 and maintain the level at the first node N1, thereby reducing a noise at the output terminal of the first shift register.

In some embodiments, the first input circuit 11 includes an eleventh transistor T11 and a twelfth transistor T12. A control electrode of the eleventh transistor T11 is connected to the first clock signal terminal CLK, a first electrode of the eleventh transistor T11 is connected to the input terminal INPUT, and a second electrode of the eleventh transistor T11 is connected to the third node N3. A control electrode of the twelfth transistor T12 is connected to the first clock signal terminal CLK, a first electrode of the twelfth transistor T12 is connected to the third node N3, and a second electrode of the twelfth transistor T12 is connected to the first node N1. When the first clock signal at the first clock signal terminal CLK is at a low level, the eleventh transistor T11 and the twelfth transistor T12 are turned on, respectively, to transmit the input signal at the input terminal INPUT to the first node N1.

In some embodiments, the pull-up output circuit 12 includes a thirteenth transistor T13 and a first capacitor C1.

A control electrode of the thirteenth transistor T13 is connected to the second node N2, a first electrode of the thirteenth transistor T13 is connected to the first operating voltage terminal, and a second electrode of the thirteenth transistor T13 is connected to the output terminal OUT. A first terminal of the first capacitor C1 is connected to the second node N2 and a second terminal of the first capacitor C1 is connected to the first operating voltage terminal. When the voltage at the second node N2 is at a low level, the thirteenth transistor T13 is turned on, to provide the voltage VGH at the first operating voltage terminal to the output terminal OUT.

In some embodiments, the pull-up control circuit 13 includes a fourteenth transistor T14 and a fifteenth transistor T15. A control electrode of the fourteenth transistor T14 is connected to the input terminal INPUT, a first electrode of the fourteenth transistor T14 is connected to the first operating voltage terminal, and a second electrode of the fourteenth transistor T14 is connected to the second node N2. A control electrode of the fifteenth transistor T15 is connected to the reset terminal RESET, a first electrode of the fifteenth transistor T15 is connected to the second node N2, and a second electrode of the fifteenth transistor T15 is connected to the second operating voltage terminal. For example, when the reset signal at the reset terminal RESET is at a low level, the fifteenth transistor T15 is turned on, providing the voltage at the second operating voltage terminal to the second node N2; when the input signal at the input terminal INPUT is at a low level, the fourteenth transistor T14 is turned on, providing the voltage at the first operating voltage terminal to the second node N2.

In some embodiments, the pull-down output circuit 14 includes a sixteenth transistor T16 and a second capacitor C2. A control electrode of the sixteenth transistor T16 is connected to the first node N1, a first electrode of the sixteenth transistor T16 is connected to the output terminal OUT, and a second electrode of the sixteenth transistor T16 is connected to the second clock signal terminal CLKB. A first terminal of the second capacitor C2 is connected to the first node N1 and a second terminal of the second capacitor C2 is connected to the output terminal OUT. When the voltage at the first node N1 is at a low level, the sixteenth transistor T16 is turned on to provide the second clock signal from the second clock signal terminal CLKB to the output terminal OUT.

In some embodiments, the first pull-down control circuit 15 includes a seventeenth transistor T17 and an eighteenth transistor T18. A control electrode of the seventeenth transistor T17 is connected to the second node N2, a first electrode of the seventeenth transistor T17 is connected to the first operating voltage terminal, and a second electrode of the seventeenth transistor T17 is connected to the fourth node N4. A control electrode of the eighteenth transistor T18 is connected to the second node N2, a first electrode of the eighteenth transistor T18 is connected to the fourth node N4, and a second electrode of the eighteenth transistor T18 is connected to the first node N1. When the voltage at the second node N2 is at a low level, the seventeenth transistor T17 and the eighteenth transistor T18 are turned on, respectively, to provide the voltage at the first operating voltage terminal to the first node N1.

In some embodiments, the first noise reduction circuit 16 includes a nineteenth transistor T19 having a control electrode connected to the output terminal OUT, a first electrode connected to the second clock signal terminal CLKB, and a second electrode connected to the third node N3. When the output signal at the output terminal OUT is at a low level and the second clock signal from the second clock signal terminal CLKB is at a low level, the nineteenth transistor T19 is turned on, so that the voltage at the third node N3 is pulled down, thereby reducing the leakage of the first node N1 from the twelfth transistor T12 as above, reducing the influence on the level at the first node N1, that is, reducing the influence on a gate level of the sixteenth transistor T16, reducing the noise at the output terminal of the first shift register, and improving the driving capability of the driving transistor.

In some embodiments, the second noise reduction circuit 17 includes a twentieth transistor M20 having a control electrode connected to the first node N1, a first electrode connected to the fourth node N4, and a second electrode connected to the second operating voltage terminal. When the voltage at the first node N1 is at a low level, the twentieth transistor M20 is turned on, so that the voltage at the fourth node N4 is pulled down, thereby reducing the leakage of the first node N1 from the eighteenth transistor T18 as above, reducing the influence on the level at the first node N1, and enabling the level at the first node N1 to be always kept at a low level.

The operation procedure of the shift register shown in FIG. 12 will be described in detail with reference to the drawings. The first operating voltage terminal provides a high level voltage VGH, the second power supply terminal provides a low level voltage VGL, and all the transistors are P-type transistors.

Figure 13:
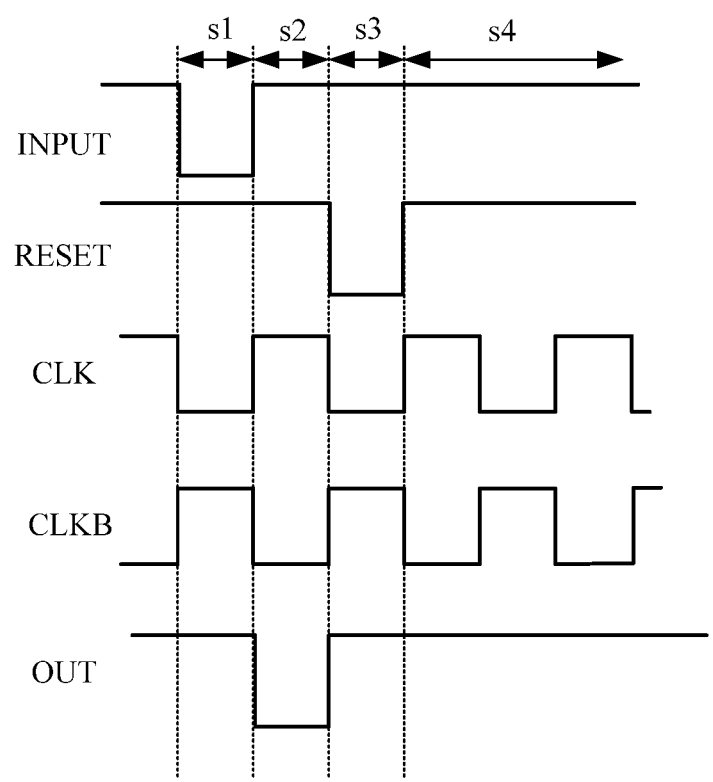
FIG. 13 is a timing diagram illustrating an operation procedure of a shift register shown in FIG. 12.

FIG. 13 is a timing diagram illustrating an operation procedure of a shift register shown in FIG. 12. As shown in FIG. 13, the operation procedure of the shift register includes: a first stage s1 to a fourth stage s4.

In the first stage s1 (input stage), a signal input from the input terminal INPUT and the first clock signal provided by the first clock signal terminal CLK are at a low level (also representing a level at the second operating voltage terminal in this embodiment), the second clock signal provided by the second clock signal terminal CLKB is at a high level (also representing the level at the first operating voltage terminal in this embodiment), and the reset signal provided by the reset terminal RESET is at a high level. The eleventh transistor T11 and the twelfth transistor T12 are turned on to transmit the low level signal at the input terminal INPUT to the first node N1, and at this time, the first node N1 is at a low level. Since the P-type transistor transmits the low level signal with a threshold loss, the level at the first node N1 is VL+|vthp|, where vthp represents a threshold voltage of the transistor T16 (assuming that threshold voltages of all transistors are the same in this embodiment). Since the first node N1 is at a low level, the sixteenth transistor T16 is turned on. Since the second clock signal provided by the second clock signal terminal CLKB is at a high level, the output terminal OUT outputs a high level signal. Meanwhile, since the signal input from the input terminal INPUT is at a low level, the fourteenth transistor T14 is turned on, the voltage at the second node N2 is pulled to VGH, and the thirteenth transistor T13 is turned off.

In the second stage s2 (pull-down stage), the signal input from the input terminal INPUT and the first clock signal provided by the first clock signal terminal CLK are at a high level, the second clock signal of the second clock signal terminal CLKB is at a low level, and the reset signal provided by the reset terminal RESET is at a high level. Since the node N1 is maintained at the low level in the previous stage s1, the sixteenth transistor T16 remains turned on. The output terminal OUT outputs a low level signal because the second clock signal of the second clock signal terminal CLKB is at the low level. Since the first clock signal of the first clock signal terminal CLK is at a high level, the eleventh transistor T11 and the twelfth transistor T12 are turned off. The second node N2 is maintained at the high level in the previous stage s1, so the seventeenth transistor T17 and the eighteenth transistor T18 are turned off, and the control electrode of the sixteenth transistor T16 is floating. Since a capacitor has a characteristic of maintaining a voltage difference between two terminals of the capacitor unchanged, the voltage difference between the two terminals of the second capacitor C2 is VL+|Vthp|−VH, which is maintained to be unchanged, so the level at the first node N1 decreases with the decrease of the level at the output terminal OUT, and finally stabilizes at 2 VL+|Vthp|−VH, where VH is a corresponding voltage when the second clock signal terminal CLKB is at the high level. The sixteenth transistor T16 operates in a linear area, the second clock signal of the second clock signal terminal CLKB is transmitted to the output terminal OUT without a threshold loss, and the output terminal OUT outputs a low level signal and has a voltage of VL. In this process, the nineteenth transistor T19 is turned on by the low level signal output from the output terminal OUT, and the level at the third node N3 is pulled down, thereby reducing the leakage current of the twelfth transistor T12, reducing the influence on the level at the first node N1, that is, reducing the influence on the gate level of the sixteenth transistor T16, and reducing the noise at the output terminal of the first shift register. Meanwhile, the level at the first node N1 is at a low level, the twentieth transistor M20 is turned on, and the level at the fourth node N4 is pulled down, so that the drain current of the eighteenth transistor T18 is reduced, and thus the influence on the level at the first node N1 is reduced, so that the level at the first node N1 can be always kept at a lower level, that is, the influence on the gate level of the sixteenth transistor T16 is reduced, the noise at the output terminal is reduced, and the driving capability of the sixteenth transistor T16 is improved.

In the third stage s3 (pull-up stage), the signal input from the input terminal INPUT and the second clock signal provided by the second clock signal terminal CLKB are at a high level, the first clock signal provided by the first clock signal terminal CLKB is at a low level, and the reset signal provided by the reset terminal RESET is at a high level. The reset signal of the reset terminal RESET is at a low level, so that the fifteenth transistor T15 is turned on, the level at the second node N2 is pulled down, the thirteenth transistor T13 is turned on, and the output terminal OUT outputs a high level signal. Meanwhile, both the seventeenth transistor T17 and the eighteenth transistor T18 are turned on, and VGH is written to the first node N1 through the seventeenth transistor T17 and the eighteenth transistor T18; in addition, the first clock signal of the first clock signal terminal CLKB is at a low level, the eleventh transistor T11 and the twelfth transistor T12 are both turned on, and a high level at the input terminal INPUT is written to the first node N1 through the eleventh transistor T11 and the twelfth transistor T12, that is, the first node is at a high level, and the sixteenth transistor is turned off.

In the fourth stage s4 (holding stage), the voltage at the second node N2 is kept at the low level, so that the thirteenth transistor T13 is kept turned on, and a level of the signal output from the output terminal OUT is stabilized at the high level. The second node N2 is maintained at the low level, so that the seventeenth transistor T17 and the eighteenth transistor T18 are turned on, stabilizing the first node N1 at the high level. A periodic transition of the first clock signal of the first clock signal terminal CLK to the low level also turns on the eleventh transistor T11 and the twelfth transistor T12, stabilizing the level at the first node N1 at the high level. Therefore, stable output of the output terminal OUT is ensured, and noise is reduced.

It should be noted that in the first gate driving circuit DC1, the first clock signal terminal CLK of the shift register at each odd stage is connected to the provided first clock signal line, the second clock signal terminal CLKB of the shift register at each odd stage is connected to the provided second clock signal line, the first clock signal terminal CLK of the shift register at each even stage is connected to the provided second clock signal line, and the second clock signal terminal CLKB of the shift register at each even stage is connected to the provided first clock signal line.

Figure 14:
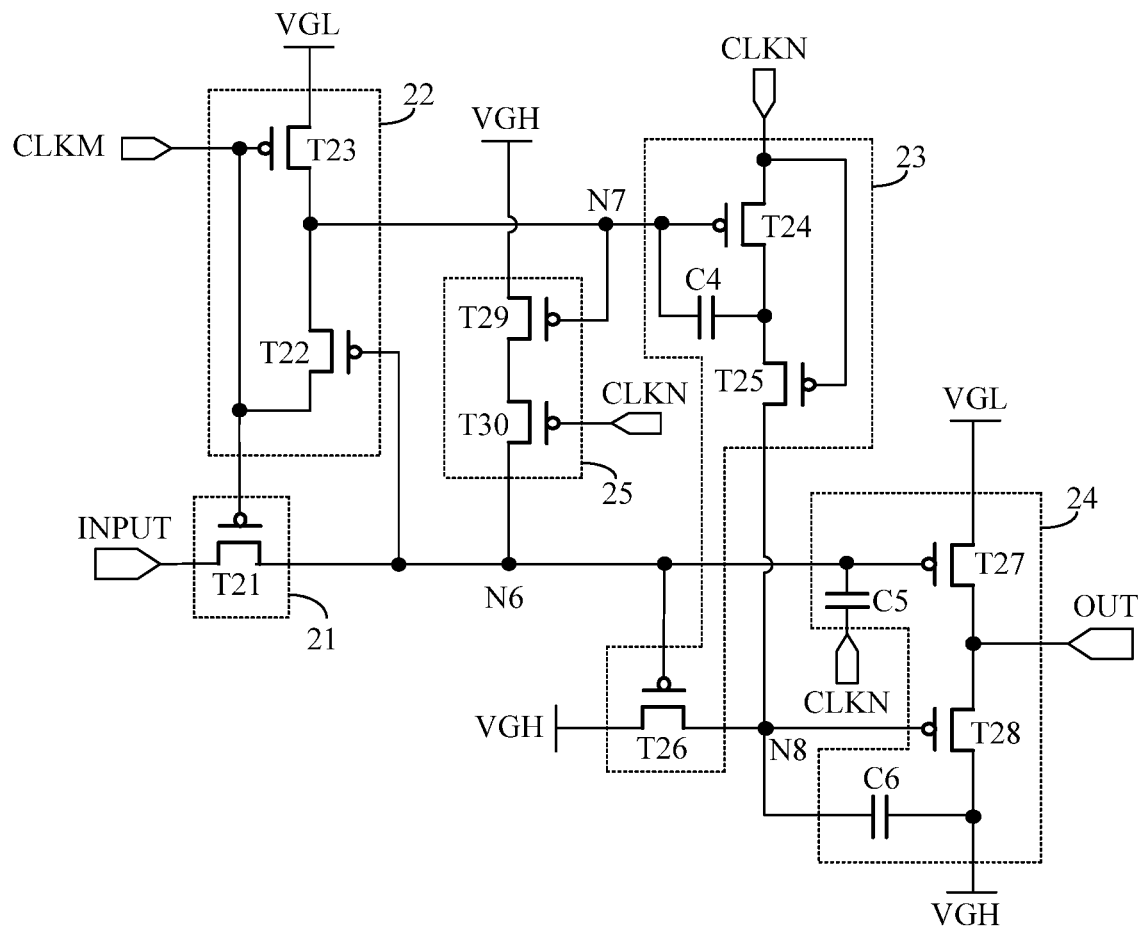
FIG. 14 is a schematic diagram of a circuit structure of a second shift register and a third shift register according to an embodiment of the present disclosure.

FIG. 14 is a schematic diagram of a circuit structure of a second shift register and a third shift register according to an embodiment of the present disclosure. As shown in FIG. 14, the second shift register and the third shift register may adopt the same circuit structure in the embodiment of the present disclosure.

The shift register in each of the second gate driving circuit DC2 and the light emitting control driving circuit DC3 specifically includes: a second input circuit 21, a voltage control circuit 22, a second pull-down control circuit 23, a second output circuit 24, and a second pull-down circuit 25.

The second input circuit 21 is connected to the input signal terminal INPUT, a sixth node N6 and a third clock signal terminal CLKM, and configured to write the input signal provided by the input signal terminal INPUT to the sixth node N6 in response to control of the third clock signal terminal CLKM.

The voltage control circuit 22 is connected to the sixth node N6, a seventh node N7, the third clock signal terminal CLKM, and is configured to write a third clock signal provided by the third clock signal terminal CLKM to the seventh node N7 in response to control of a voltage at the sixth node N6, and write a third operating voltage provided by a third operating voltage terminal to the seventh node N7 in response to control of the third clock signal terminal CLKM.

The second pull-down control circuit 23 is connected to a fourth operating voltage terminal, the sixth node N6, an eighth node N8, the seventh node N7, and a fourth clock signal terminal CLKN, and configured to write a fourth clock signal provided by the fourth clock signal terminal CLKN to the eighth node N8 in response to control of a voltage at the seventh node N7 and the fourth clock signal terminal CLKN, and write a fourth operating voltage provided by the fourth operating voltage terminal to the eighth node N8 in response to control of a voltage at the sixth node N6.

The second output circuit 24 is connected to the third operating voltage terminal, the fourth operating voltage terminal, the sixth node N6, the eighth node N8, and a signal output terminal, and is configured to write the third operating voltage to the signal output terminal in response to control of the voltage at the sixth node N6, and to write the fourth operating voltage to the signal output terminal in response to control of the eighth node N8.

The second pull-down circuit 25 is connected to the fourth operating voltage terminal, the sixth node N6, the seventh node N7, and the fourth clock signal terminal CLKN, and is configured to write the fourth operating voltage to the sixth node N6 in response to control of a voltage at the seventh node N7 and the second clock signal terminal CLKB.

In some embodiments, the second input circuit 21 includes a twenty-first transistor T21; the voltage control circuit 22 includes a twenty-second transistor T22 and a twenty-third transistor T23; the second pull-down control circuit 23 includes a twenty-fourth transistor T24, a twenty-fifth transistor T25, a twenty-sixth transistor T26 and a fourth capacitor C4; the second output circuit 24 includes a twenty-seventh transistor T27, a twenty-eighth transistor T28, a fifth capacitor C5 and a sixth capacitor C6; and the second pull-down circuit 25 includes a twenty-ninth transistor T29 and a thirtieth transistor T30.

A control electrode of the twenty-first transistor T21 is connected to the third clock signal terminal CLKM, a first electrode of the twenty-first transistor T21 is connected to the input signal terminal INPUT, and a second electrode of the twenty-first transistor T21 is connected to the sixth node N6.

A control electrode of the twenty-second transistor T22 is connected to the sixth node N6, a first electrode of the twenty-second transistor T22 is connected to the third clock signal terminal CLKM, and a second electrode of the twenty-second transistor T22 is connected to the seventh node N7.

A control electrode of the twenty-third transistor T23 is connected to the third clock signal terminal CLKM, a first electrode of the twenty-third transistor T23 is connected to the third operating voltage terminal, and a second electrode of the twenty-third transistor T23 is connected to the seventh node N7.

A control electrode of the twenty-fourth transistor T24 is connected to the seventh node N7, a first electrode of the twenty-fourth transistor T24 is connected to the fourth clock signal terminal CLKN, and a second electrode of the twenty-fourth transistor T24 is connected to a first electrode of the twenty-fifth transistor T25.

A control electrode of the twenty-fifth transistor T25 is connected to the fourth clock signal terminal CLKN, and a second electrode of the twenty-fifth transistor T25 is connected to the eighth node N8.

A control electrode of the twenty-sixth transistor T26 is connected to the sixth node N6, a first electrode of the twenty-sixth transistor T26 is connected to the fourth operating voltage terminal, and a second electrode of the twenty-sixth transistor T26 is connected to the eighth node N8.

A control electrode of the twenty-seventh transistor T27 is connected to the sixth node N6, a first electrode of the twenty-seventh transistor T27 is connected to the third operating voltage terminal, and a second electrode of the twenty-seventh transistor T27 is connected to the signal output terminal.

A control electrode of the twenty-eighth transistor T28 is connected to the eighth node N8, a first electrode of the twenty-eighth transistor T28 is connected to the fourth operating voltage terminal, and a second electrode of the twenty-eighth transistor T28 is connected to the signal output terminal.

A control electrode of the twenty-ninth transistor T29 is connected to the seventh node N7, a first electrode of the twenty-ninth transistor T29 is connected to the fourth operating voltage terminal, and a second electrode of the twenty-ninth transistor T29 is connected to a first electrode of the thirtieth transistor T30;

A control electrode of the thirtieth transistor T30 is connected to the fourth clock signal terminal CLKN, and a second electrode of the thirtieth transistor T30 is connected to the sixth node N6.

A first terminal of the fourth capacitor C4 is connected to the control electrode of the twenty-fourth transistor T24, and a second terminal of the fourth capacitor C4 is connected to the second electrode of the twenty-fourth transistor and the first electrode of the twenty-fifth transistor.

A first terminal of the fifth capacitor C5 is connected to the control electrode of the twenty-seventh transistor T27, and a second terminal of the fifth capacitor C5 is connected to the fourth clock signal terminal CLKN.

A first terminal of the sixth capacitor C6 is connected to the eighth node N8, and a second terminal of the sixth capacitor C6 is connected to the fourth operating voltage terminal.

The operation procedure of the shift register shown in FIG. 14 will be described in detail with reference to the drawings. The third operating voltage terminal provides a low level operating voltage VGL, and the fourth operating voltage terminal provides a high level operating voltage VGH.

Figure 15:
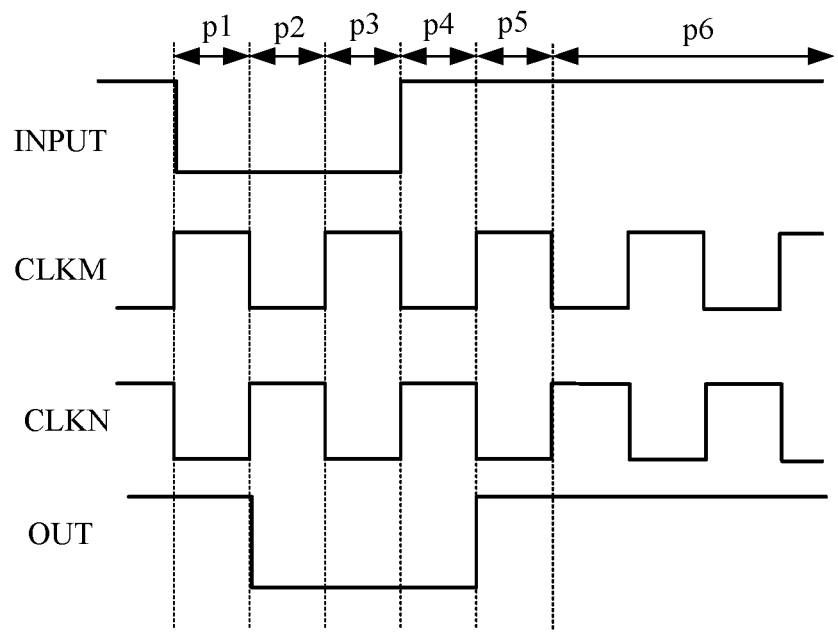
FIG. 15 is a timing diagram illustrating an operation procedure of a shift register shown in FIG. 14.

FIG. 15 is a timing diagram illustrating an operation procedure of a shift register shown in FIG. 14. As shown in FIG. 15, the operation procedure of the shift register includes: a charging stage p1, a first output stage p2, a second output stage p3, a third output stage p4, a reset stage p5 and a holding stage p6.

In the charging stage p1, the input signal terminal INPUT provides a low level signal, the third clock signal terminal CLKM provides a high level signal, and the fourth clock signal terminal CLKN provides a low level signal. At this time, the twenty-fourth transistor T24, the twenty-fifth transistor T25, the twenty-eighth transistor T28, the twenty-ninth transistor T29, and the thirtieth transistor T30 are all turned on, and the twenty-first transistor T21, the twenty-second transistor T22, the twenty-third transistor T23, the twenty-sixth transistor T26, and the twenty-seventh transistor T27 are all turned off; the seventh node N7 and the eighth node N8 are in a low level state, and the sixth node N6 is in a high level state. The high level operating voltage VGH is written to the signal output terminal OUT through the twenty-eighth transistor T28, and thus the signal output terminal OUT outputs a high level signal.

In the first output stage p2, the input signal terminal INPUT provides a low level signal, the third clock signal terminal CLKM provides a low level signal, and the fourth clock signal terminal CLKN provides a high level signal. At this time, the twenty-first transistor T21, the twenty-second transistor T22, the twenty-third transistor T23, the twenty-fourth transistor T24, the twenty-sixth transistor T26, the twenty-seventh transistor T27, and the twenty-ninth transistor T29 are all turned on, and the twenty-fifth transistor T25, the twenty-eighth transistor T28, and the thirtieth transistor T30 are all turned off. The seventh node N7 and the sixth node N6 are in a low level state, and the eighth node N8 is in a high level state. The low level operating voltage VGL is written to the signal output terminal OUT through the twenty-seventh transistor T27, and thus the signal output terminal OUT outputs a low level signal.

In the second output stage p3, the input signal terminal INPUT provides a low level signal, the third clock signal terminal CLKM provides a high level signal, and the fourth clock signal terminal CLKN provides a low level signal. At this time, the twenty-second transistor T22, the twenty-fifth transistor T25, the twenty-sixth transistor T26, the twenty-seventh transistor T27, and the thirtieth transistor T30 are all turned on, and the twenty-first transistor T21, the twenty-third transistor T23, the twenty-fourth transistor T24, the twenty-eighth transistor T28, and the twenty-ninth transistor T29 are all turned off. The sixth node N6 is in a low level state, and the seventh node N7 and the eighth node N8 are both in a high level state. The low level operating voltage VGL is written to the signal output terminal OUT through the twenty-seventh transistor T27, and thus the signal output terminal OUT outputs a low level signal.

In the third output stage p4, the input signal terminal INPUT provides a high level signal, the third clock signal terminal CLKM provides a low level signal, and the fourth clock signal terminal CLKN provides a high level signal. The twenty-first transistor T21, the twenty-third transistor T23, the twenty-fourth transistor T24, and the twenty-ninth transistor T29 are all turned on, and the twenty-second transistor T22, the twenty-fifth transistor T25, the twenty-sixth transistor T26, the twenty-seventh transistor T27, the twenty-eighth transistor T28, and the thirtieth transistor T30 are all turned off; the seventh node N7 is in a low level state, and the sixth node N6 and the eighth node N8 are both in a high level state. Since both the twenty-seventh transistor T27 and the twenty-eighth transistor T28 are turned off, the signal output terminal OUT is in a floating state, and is maintained in a low level state in the previous stage, that is, the signal output terminal OUT outputs a low level signal.

In the reset stage p5, the input signal terminal INPUT provides a high level signal, the third clock signal terminal CLKM provides a high level signal, and the fourth clock signal terminal CLKN provides a low level signal. At this time, the twenty-fourth transistor T24, the twenty-fifth transistor T25, the twenty-eighth transistor T28, the twenty-ninth transistor T29, and the thirtieth transistor T30 are all turned on, and the twenty-first transistor T21, the twenty-second transistor T22, the twenty-third transistor T23, the twenty-sixth transistor T26, and the twenty-seventh transistor T27 are all turned off. The seventh node N7 and the eighth node N8 are both in a low level state, and the sixth node N6 is in a high level state. The high level operating voltage VGH is written to the signal output terminal OUT through the twenty-eighth transistor T28, and thus the signal output terminal OUT outputs a high level signal.

In the holding stage p6, the input signal terminal INPUT provides a high level signal, the third clock signal terminal CLKM provides a clock signal that switches between high/low levels, and the fourth clock signal terminal CLKN provides a clock signal that switches between high/low levels. The sixth node N6 is always in a high level state, the eighth node N8 is always in a low level state, the twenty-eighth transistor T28 is kept to be turned on, the twenty-seventh transistor T27 is kept to be turned off, and the signal output terminal OUT is kept to output a high level signal.

It should be noted that in each of the second gate driving circuit DC2 and the light emitting control driving circuit DC3, the third clock signal terminal CLKM of the shift register at each odd stage is connected to the provided first clock signal line, the fourth clock signal terminal CLKN of the shift register at each odd stage is connected to the provided second clock signal line, the third clock signal terminal CLKM of the shift register at each even stage is connected to the provided second clock signal line, and the fourth clock signal terminal CLKN of the shift register at each even stage is connected to the provided first clock signal line.

As can be seen from FIGS. 15 and 13, a waveform of the signal output from the signal output terminal OUT of the shift register is the same as that of the signal input to the signal input terminal INPUT, i.e., the signal output from the signal output terminal OUT and the signal input to the signal input terminal INPUT have the same pulse width. The waveform of the signal input to the signal input terminal INPUT of the shift register is determined by a waveform of a signal provided by the frame starting signal line provided for the driving circuit including the shift register.

It should be noted that in the case where the first shift register adopts the circuit structure shown in FIG. 12, the second shift register and the third shift register adopt the circuit structure shown in FIG. 14, which is only exemplary, and does not limit the technical solution of the present disclosure. In the embodiment of the present disclosure, the first to third shift registers may also be independently selected from other circuit structures, which is not enumerated here.

Figure 16A:
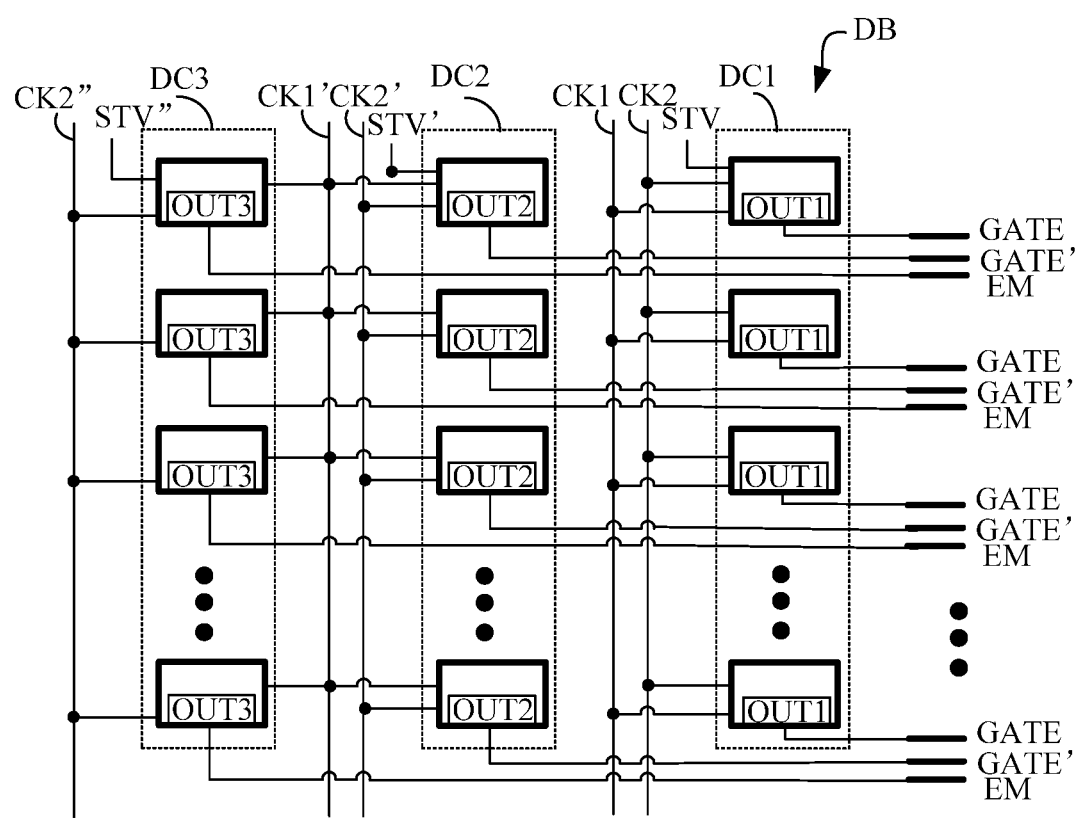
FIGS. 16A to 16C are schematic diagrams of three different structures for a driving module in FIG. 3.
Figure 16B:
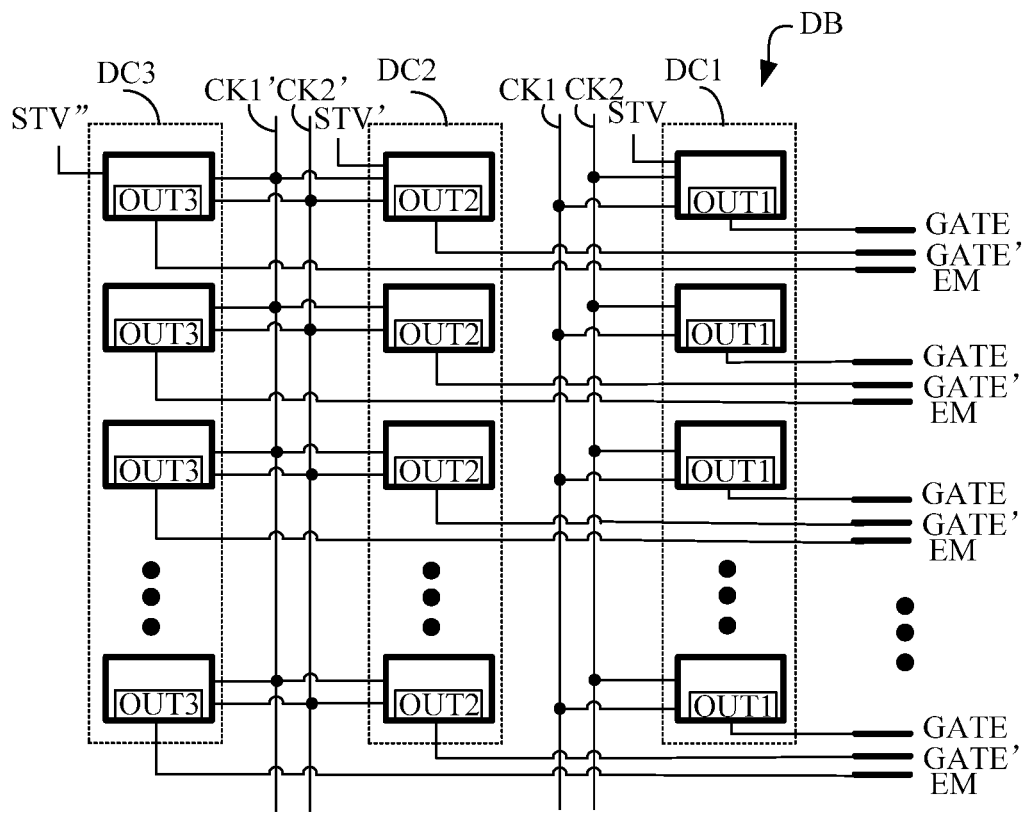
Figure 16C:
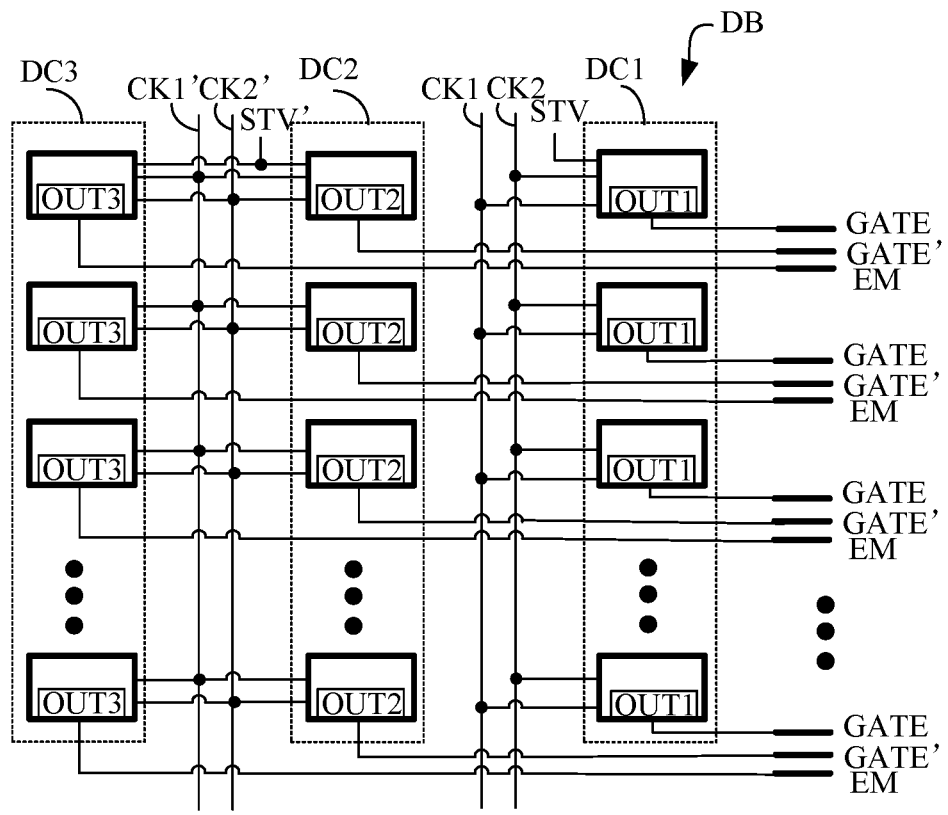

FIGS. 16A to 16C are schematic diagrams of three different structures of a driving module in FIG. 3. As shown in FIGS. 16A to 16C, in the three cases shown in FIGS. 16A to 16C, the first gate driving circuit DC1 does not share a clock signal line with the other two driving circuits (the second gate driving circuit DC2 and the light emitting control driving circuit DC3). That is, the first gate driving circuit is provided with the independent first clock signal line CK1 and the independent second clock signal line CK2. The second gate driving circuit DC2 and the light emitting control driving circuit DC3 share a clock signal line.

Referring to FIG. 16A, the first clock signal line provided for the second gate driving circuit DC2 and the light emitting control driving circuit DC3 is the same first clock signal line CK1', and the second clock signal line CK2' provided for the second gate driving circuit DC2 and the second clock signal line CK2" provided for the light emitting control driving circuit DC3 are different clock signal lines.

In some embodiments, the first clock signal line CK1' shared by the second gate driving circuit DC2 and the light emitting control driving circuit DC3 is located between the second gate driving circuit DC2 and the light emitting control driving circuit DC3.

Referring to FIG. 16B, in some embodiments, the first clock signal line provided for the second gate driving circuit DC2 and the light emitting control driving circuit DC3 is the same first clock signal line CK1', and the second clock signal line provided for the second gate driving circuit DC2 and the light emitting control driving circuit DC3 is the same second clock signal line CK2'.

In some embodiments, the first clock signal line CK1' shared by the second gate driving circuit DC2 and the light emitting control driving circuit DC3 is located between the second gate driving circuit DC2 and the light emitting control driving circuit DC3, and the second clock signal line CK2' shared by the second gate driving circuit DC2 and the light emitting control driving circuit DC3 is located between the second gate driving circuit DC2 and the light emitting control driving circuit DC3.

In addition, in the case shown in FIGS. 16A and 16B, the first gate driving circuit DC1, the second gate driving circuit DC2, and the light emitting control driving circuit DC3 are provided with independent frame starting signal lines STV, STV', STV", respectively.

Referring to FIG. 16C, in some embodiments, the second gate driving circuit DC2 and the light emitting control driving circuit DC3 not only share the first clock signal line CK1' and the second clock signal line CK2', but also both the second gate driving circuit DC2 and the light emitting control driving circuit DC3 are connected to the same frame starting signal line STV'.

Referring to FIGS. 10 and 11, when the writing and compensating circuit in the pixel circuit includes the third transistor, the fourth transistor, the fifth transistor, and the seventh transistor, waveforms of signals provided by the second gate line GATE' and the light emitting control signal line EM during driving the pixel circuit may be the same; that is, the second gate driving circuit DC2 for outputting an electrical signal to the second gate line GATE' and the light emitting control driving circuit DC3 for outputting an electrical signal to the light emitting control signal line EM may be connected to the same frame starting signal line STV'.

In some embodiments, the frame starting signal line STV' shared by the second gate driving circuit DC2 and the light emitting control driving circuit DC3 is located between the second gate driving circuit DC2 and the light emitting control driving circuit DC3.

Compared with the technical solution in the related art in which each driving circuit is provided with an independent frame starting signal line, in the embodiment of the present disclosure, the second gate driving circuit DC2 and the light emitting control driving circuit DC3 share the same frame starting signal line STV', so that the total number of frame starting signal lines required to be provided for the entire driving module DB can be reduced, i.e., the total number of operating signal lines can be reduced; at this time, the width of the peripheral area can be reduced correspondingly, which is beneficial to realizing a narrow frame.

Referring to FIGS. 16A to 16C, in some embodiments, the first clock signal line CK1 and the second clock signal line CK2 provided for the first gate driving circuit DC1 are both located between the first gate driving circuit DC1 and the second gate driving circuit DC2.

Figure 17A:
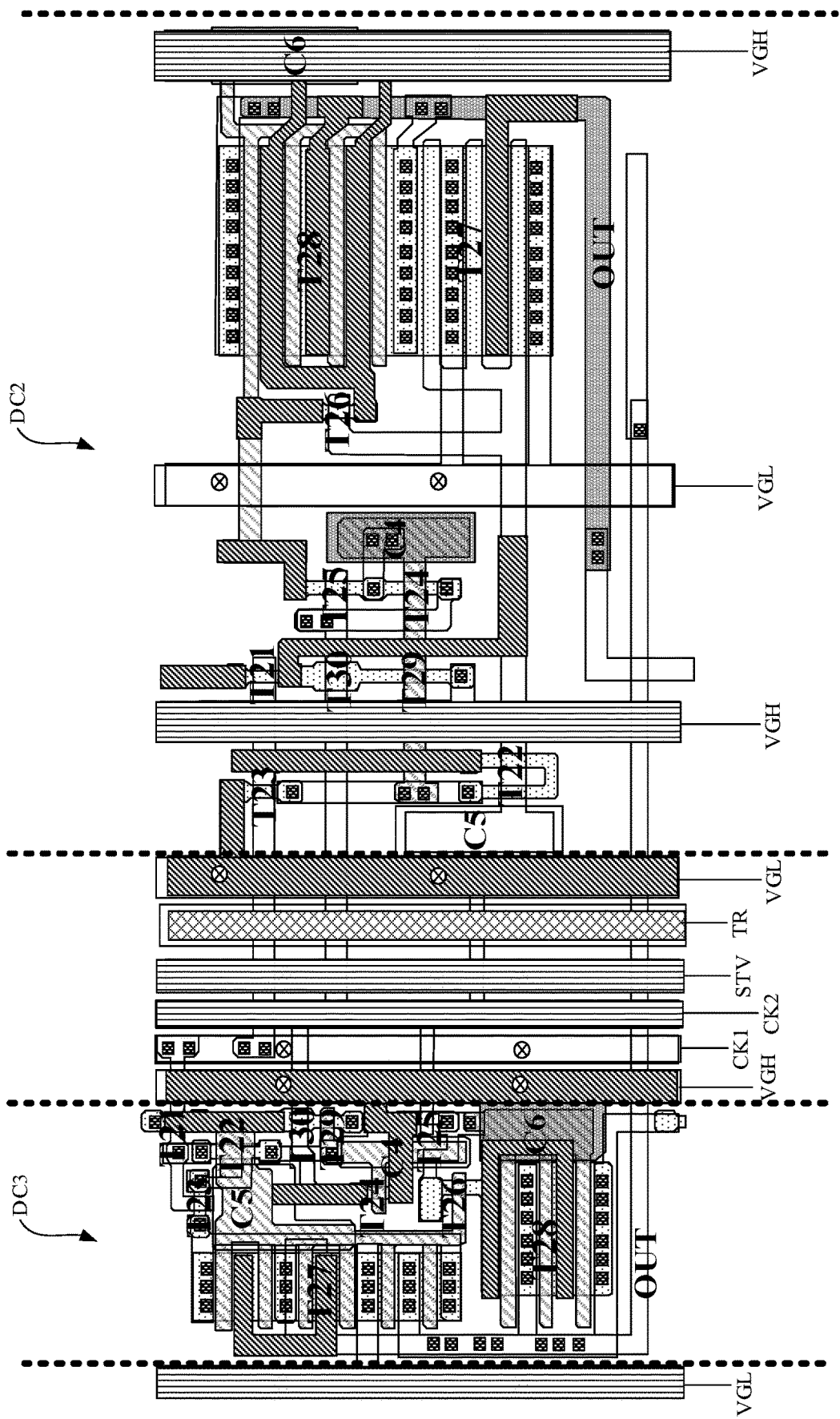
FIGS. 17A to 17O are layouts of partial areas and layouts of respective film layers of a second gate driving circuit and a light emitting control driving circuit when a driving module is shown as in FIG. 16C.
Figure 17B:
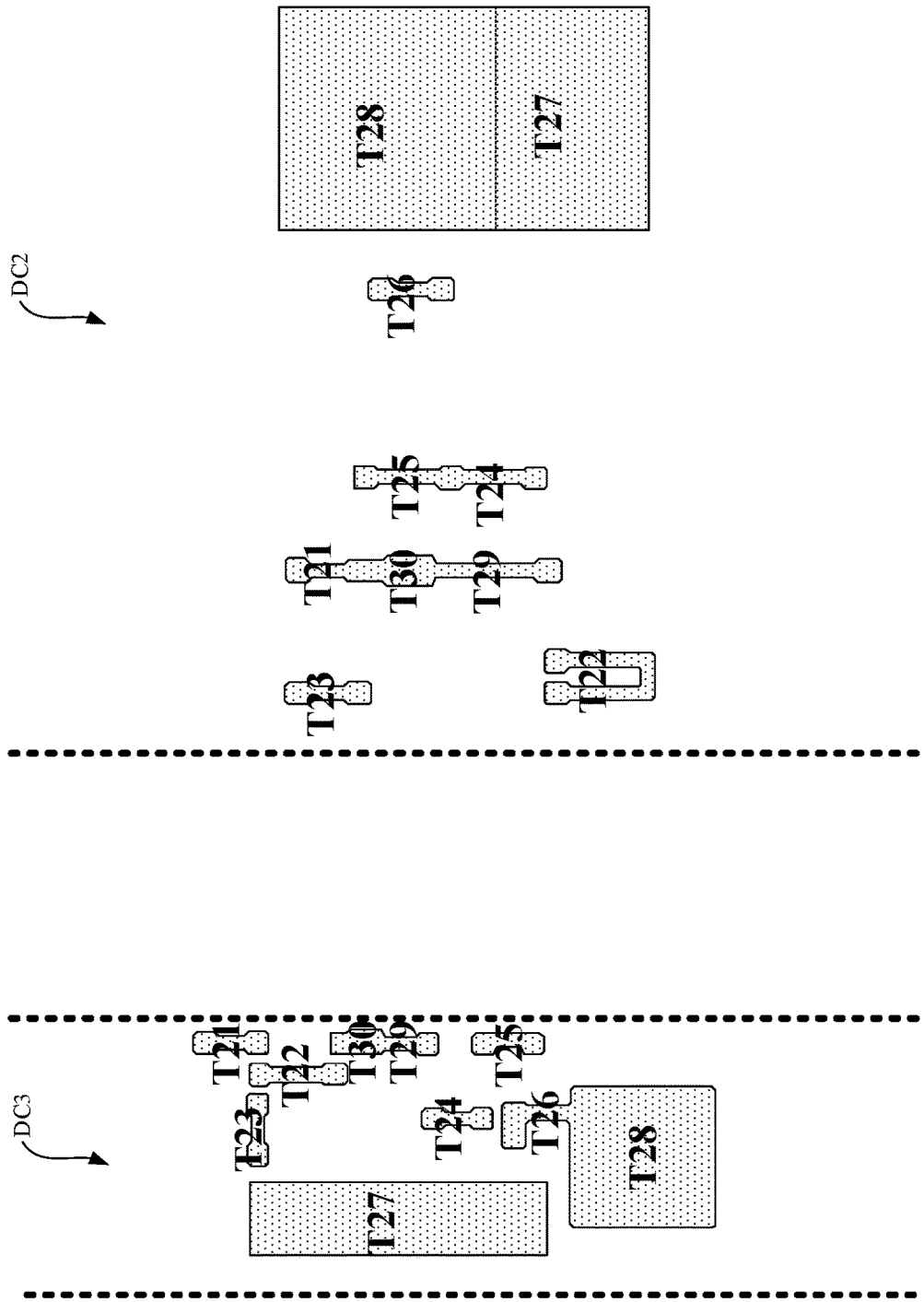
Figure 17C:
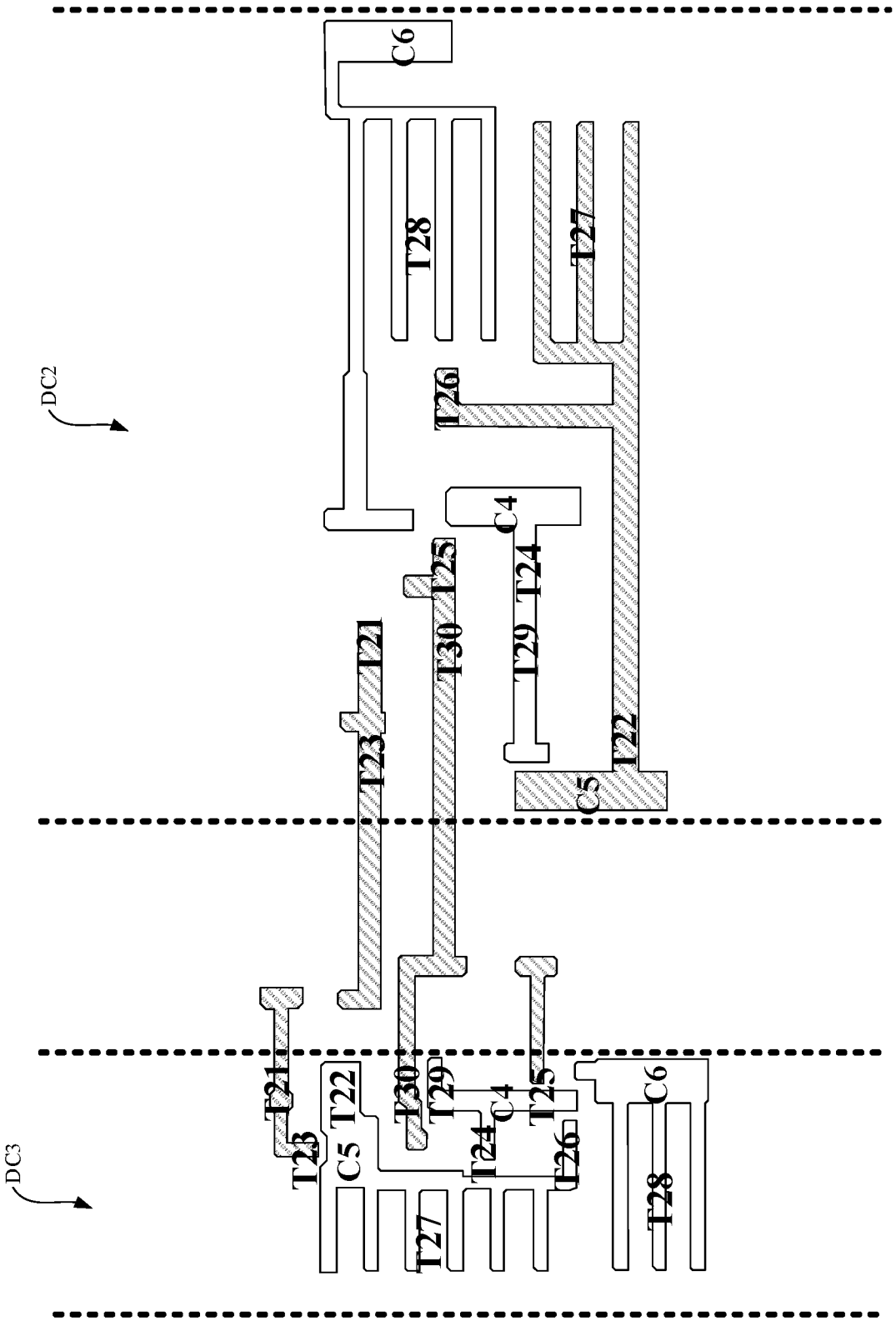
Figure 17D:
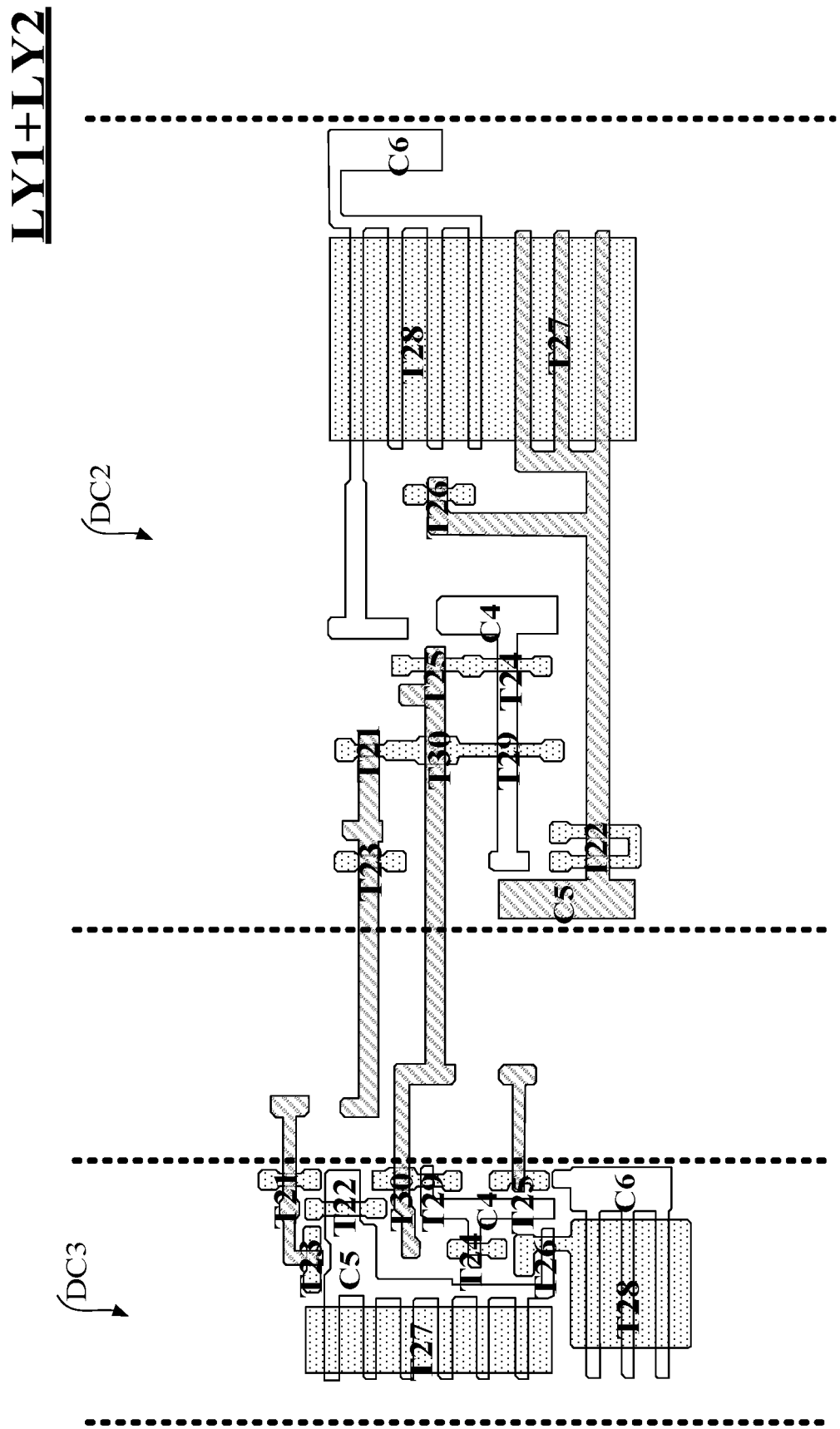
Figure 17E:
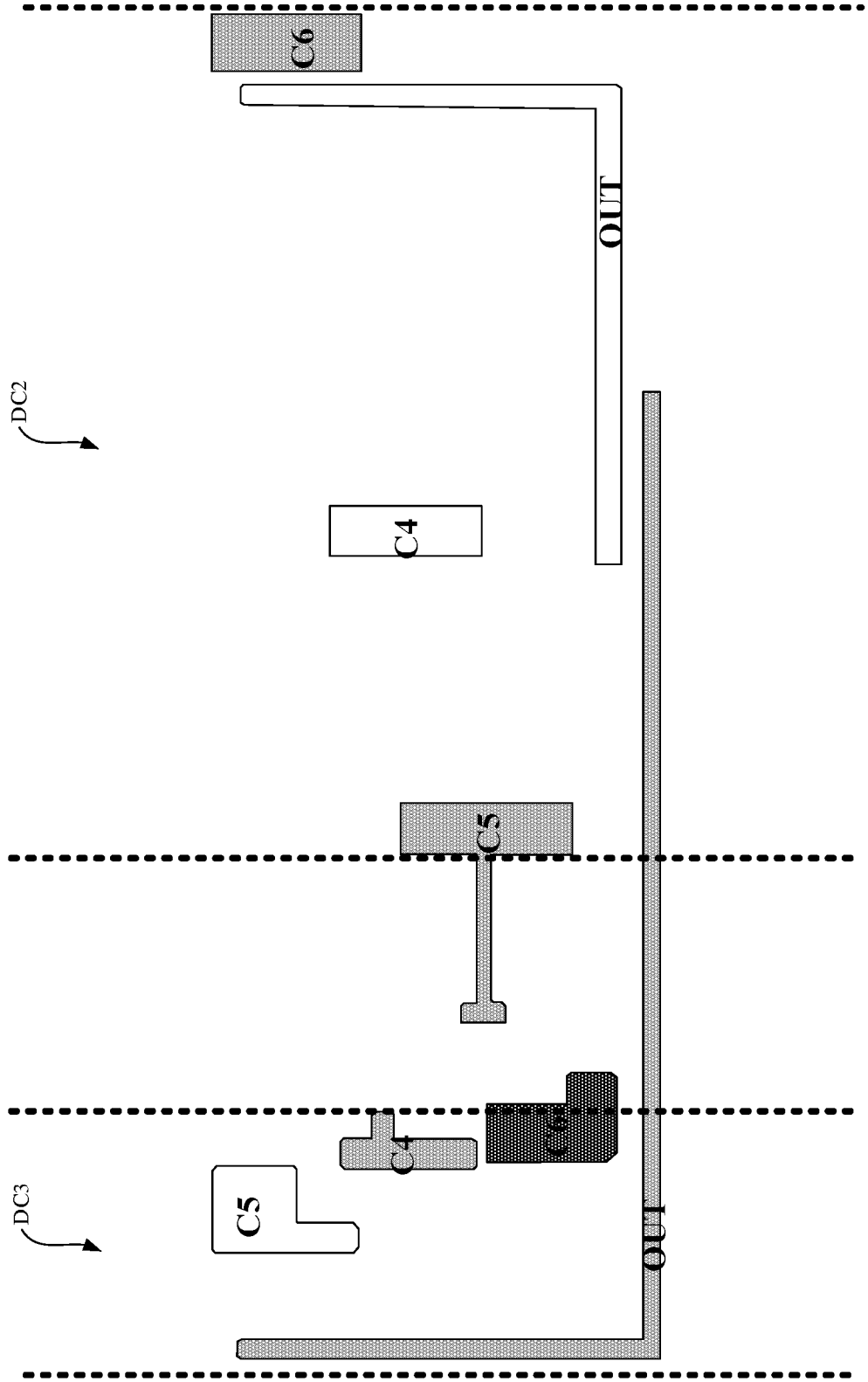
Figure 17F:
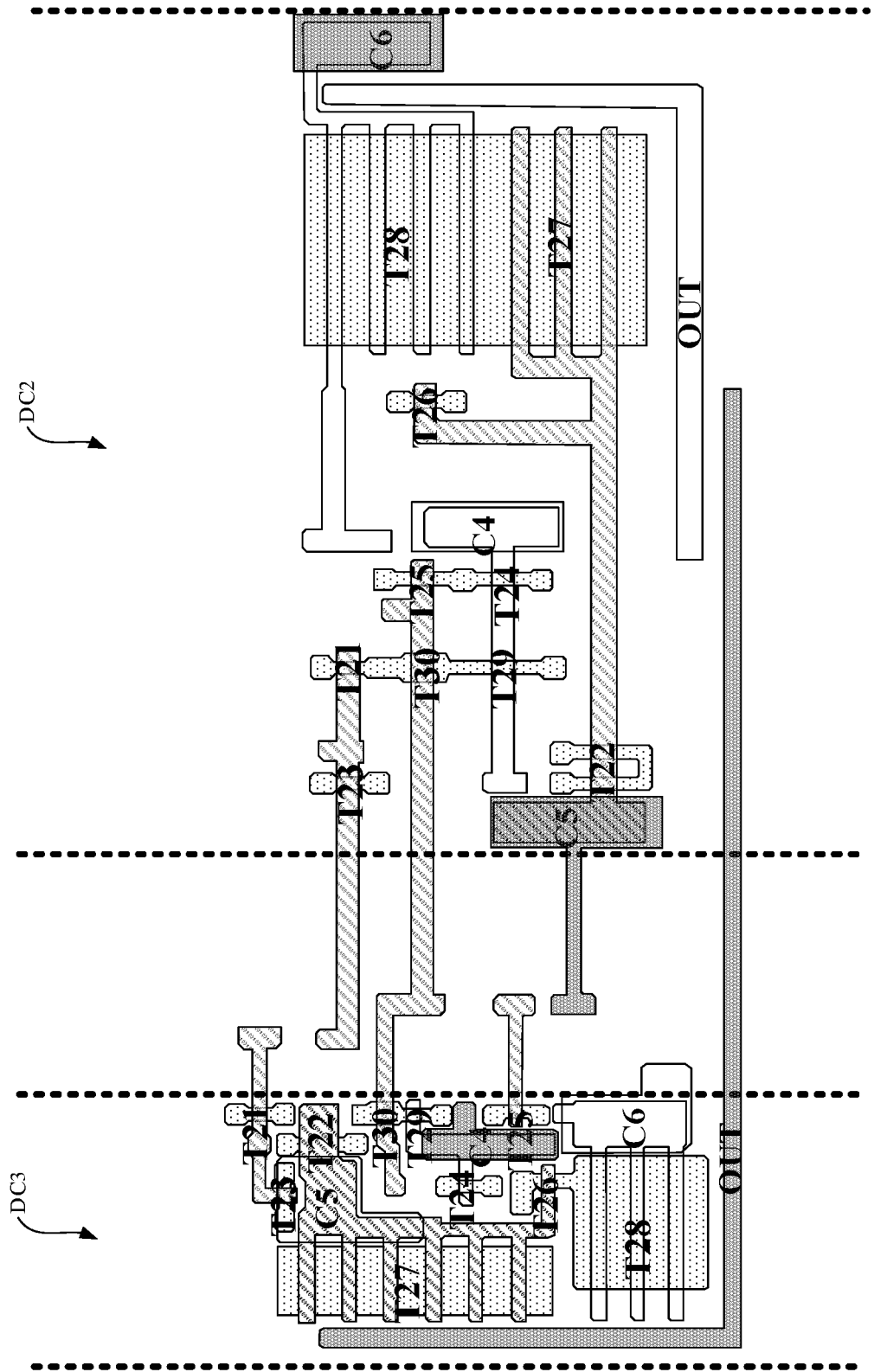
Figure 17G:
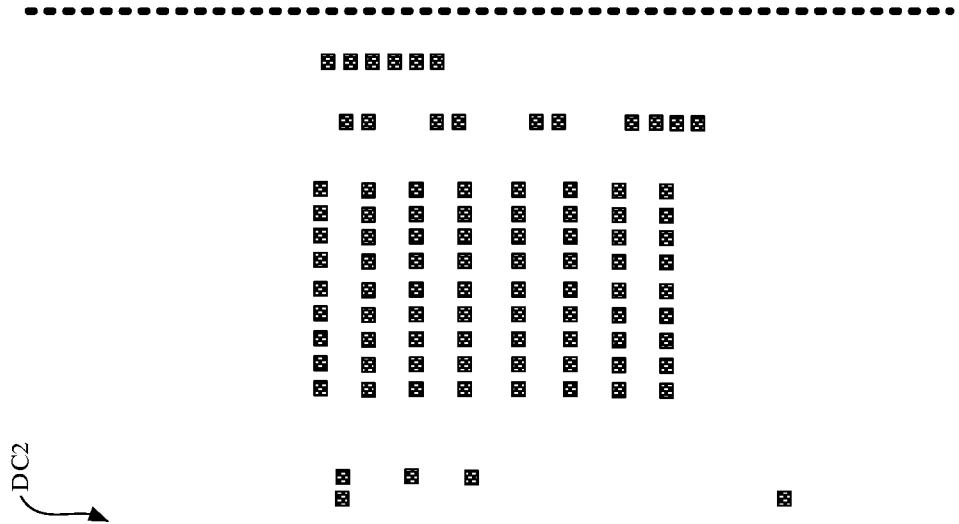
Figure 17G:
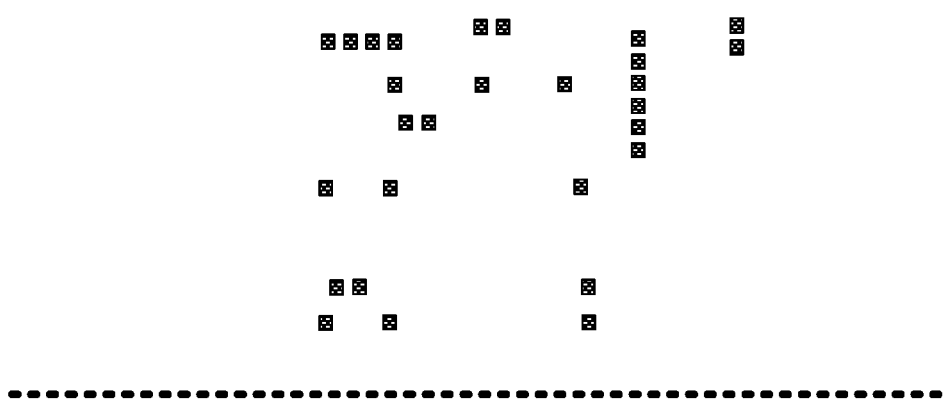
Figure 17G:
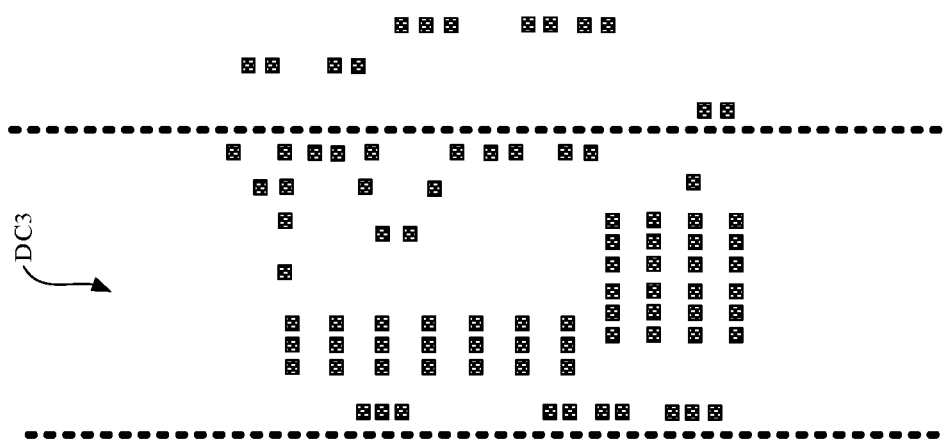
Figure 17H:
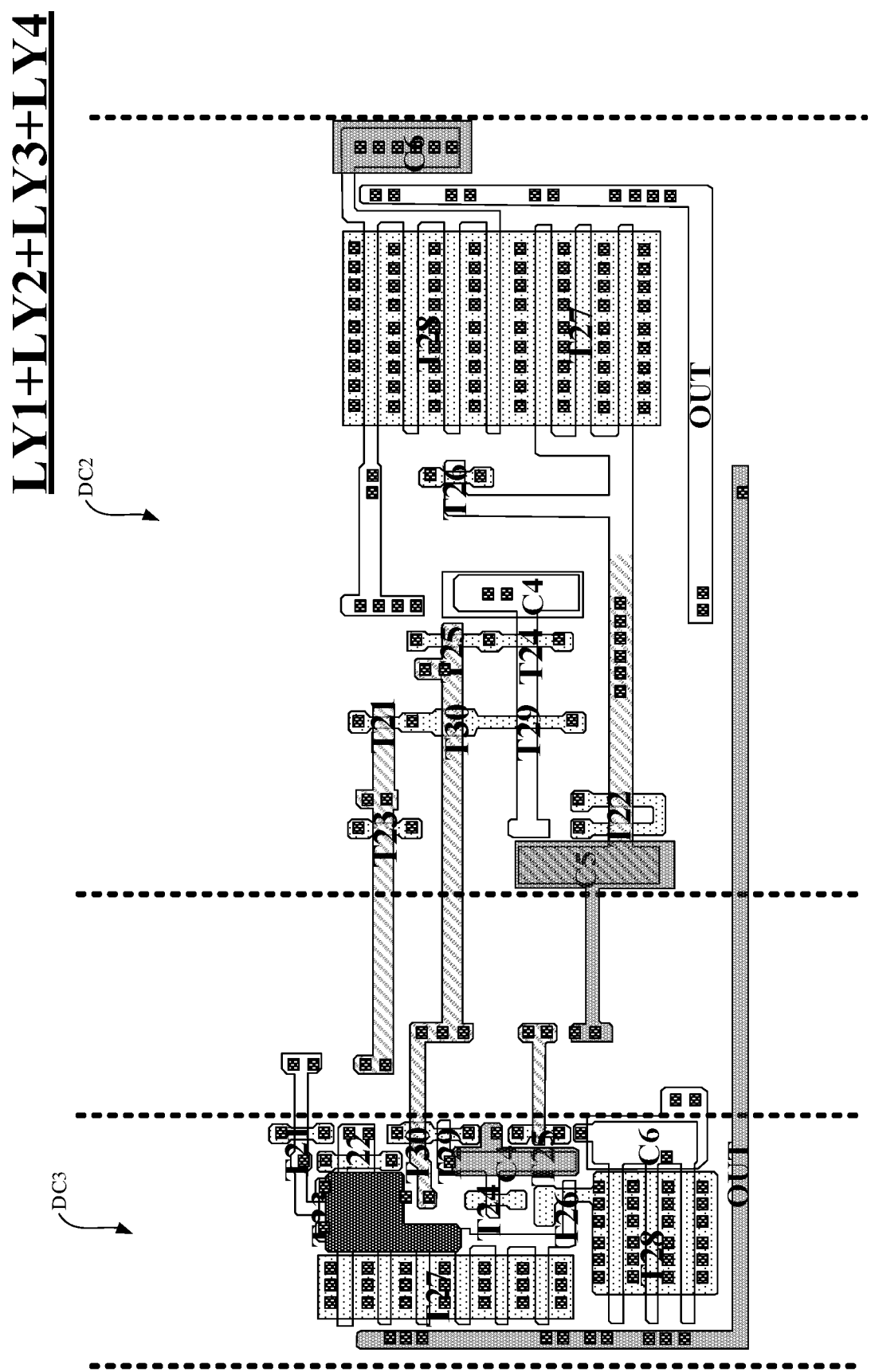
Figure 17I:
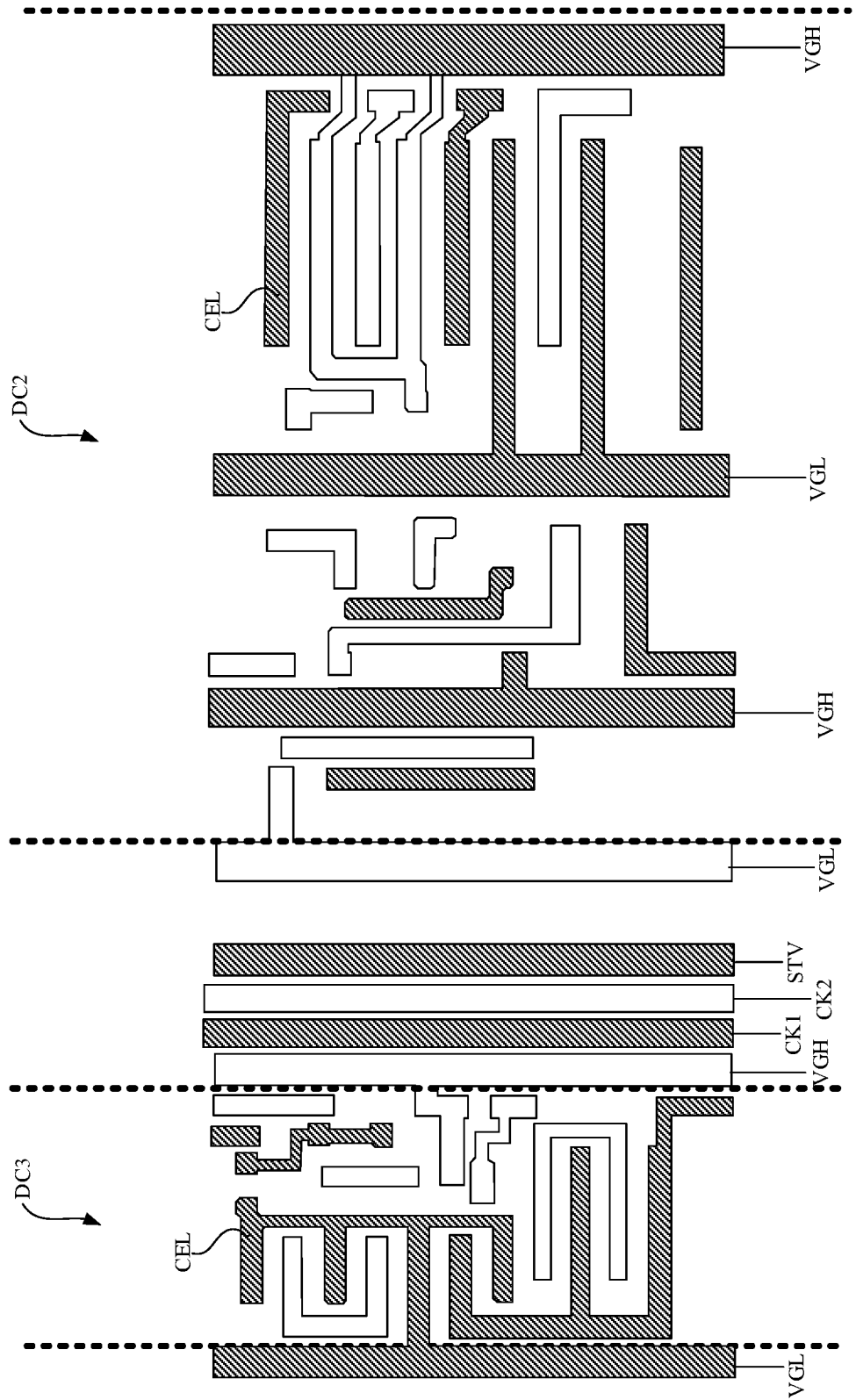
Figure 17J:
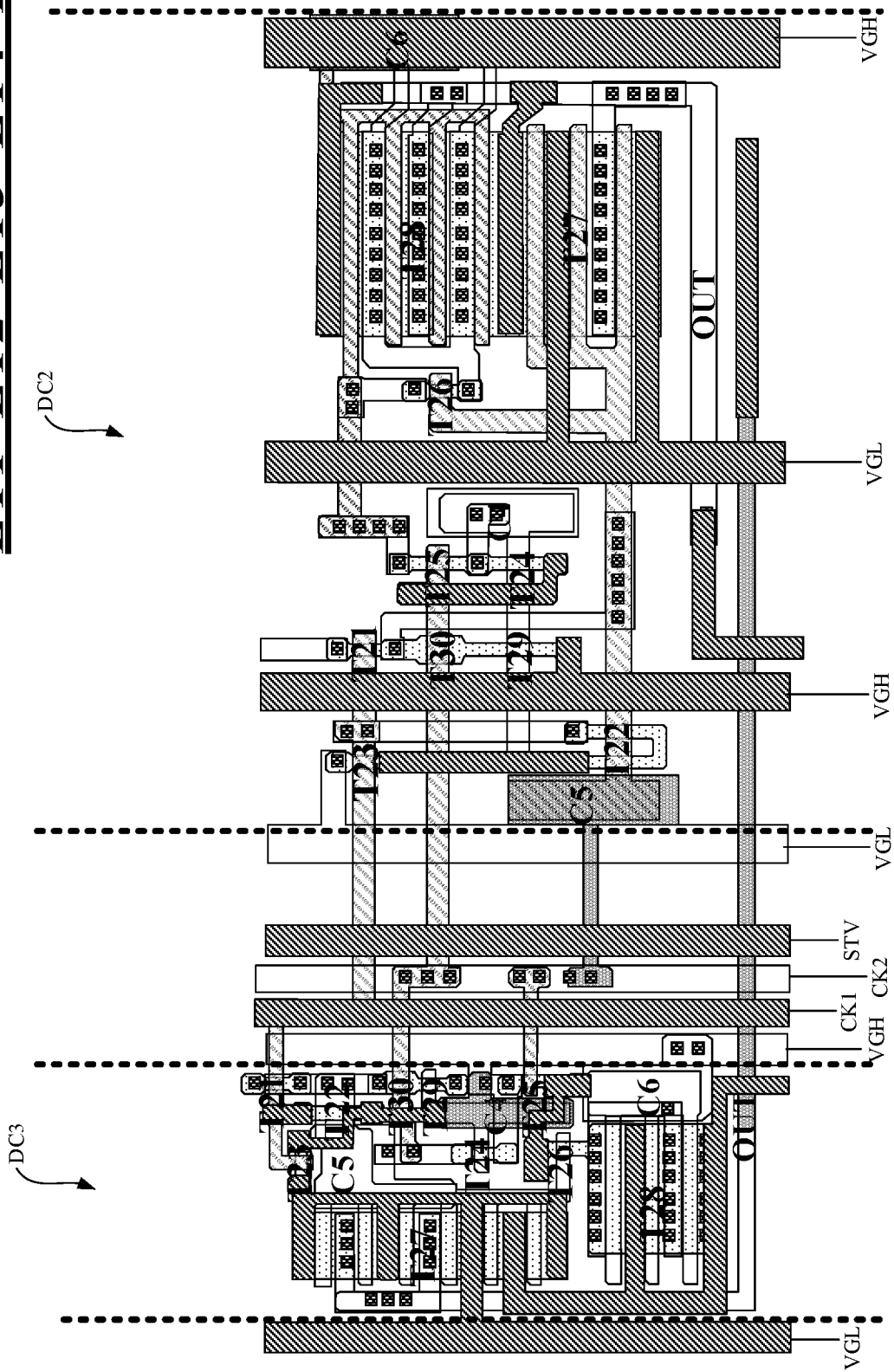
Figure 17L:
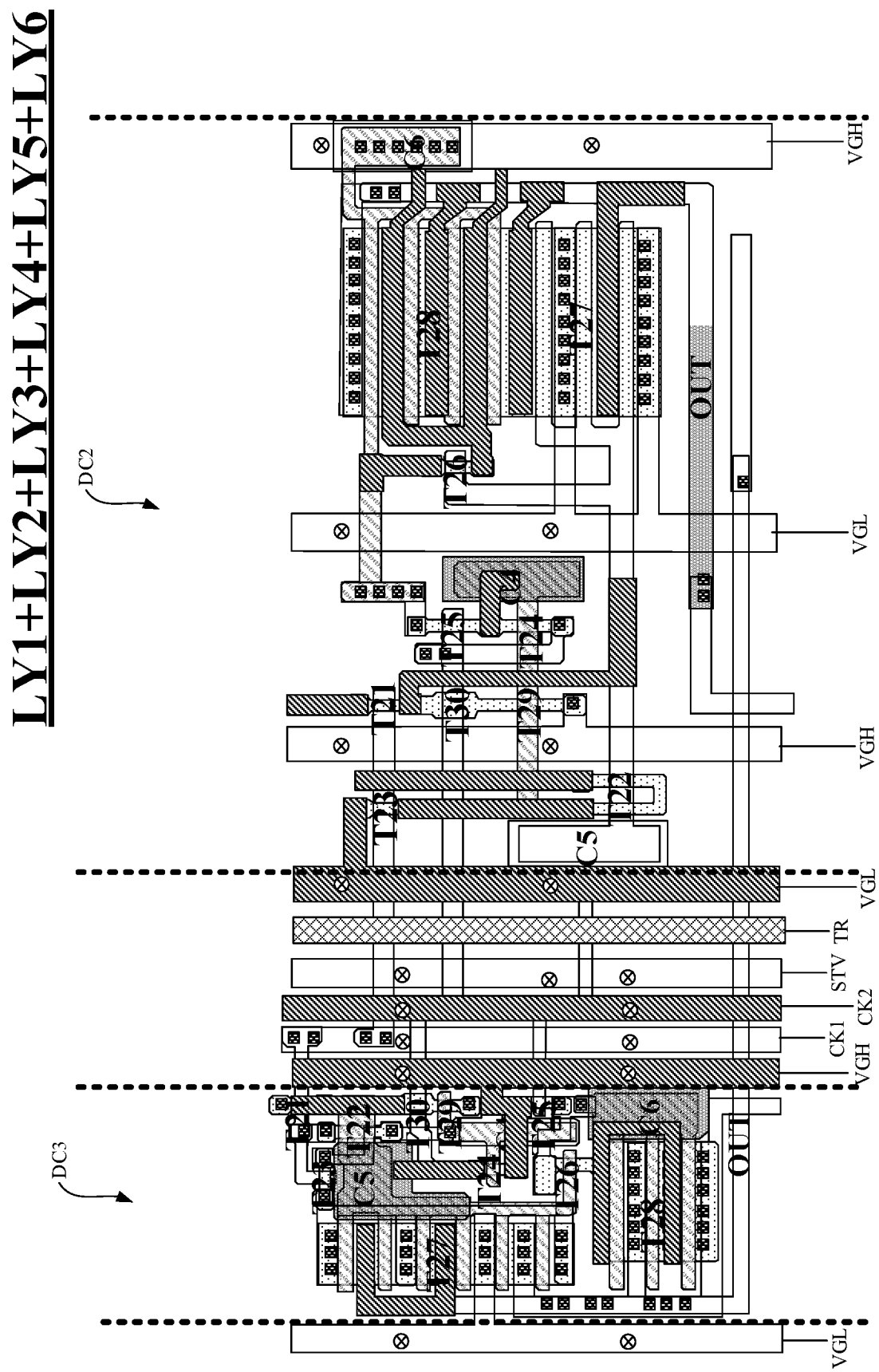
Figure 17M:
Figure 17M:
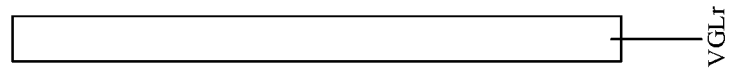
Figure 17M:
Figure 17M:
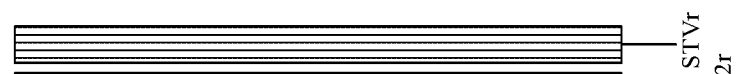
Figure 17M:
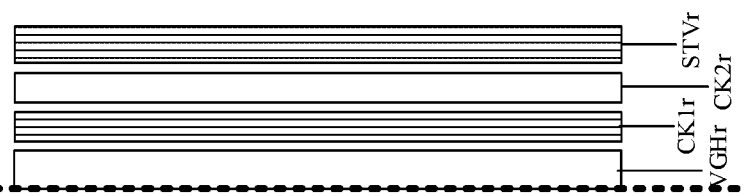
Figure 17M:
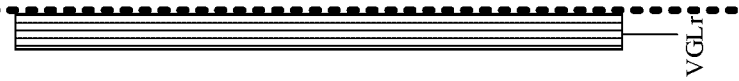
Figure 17N:
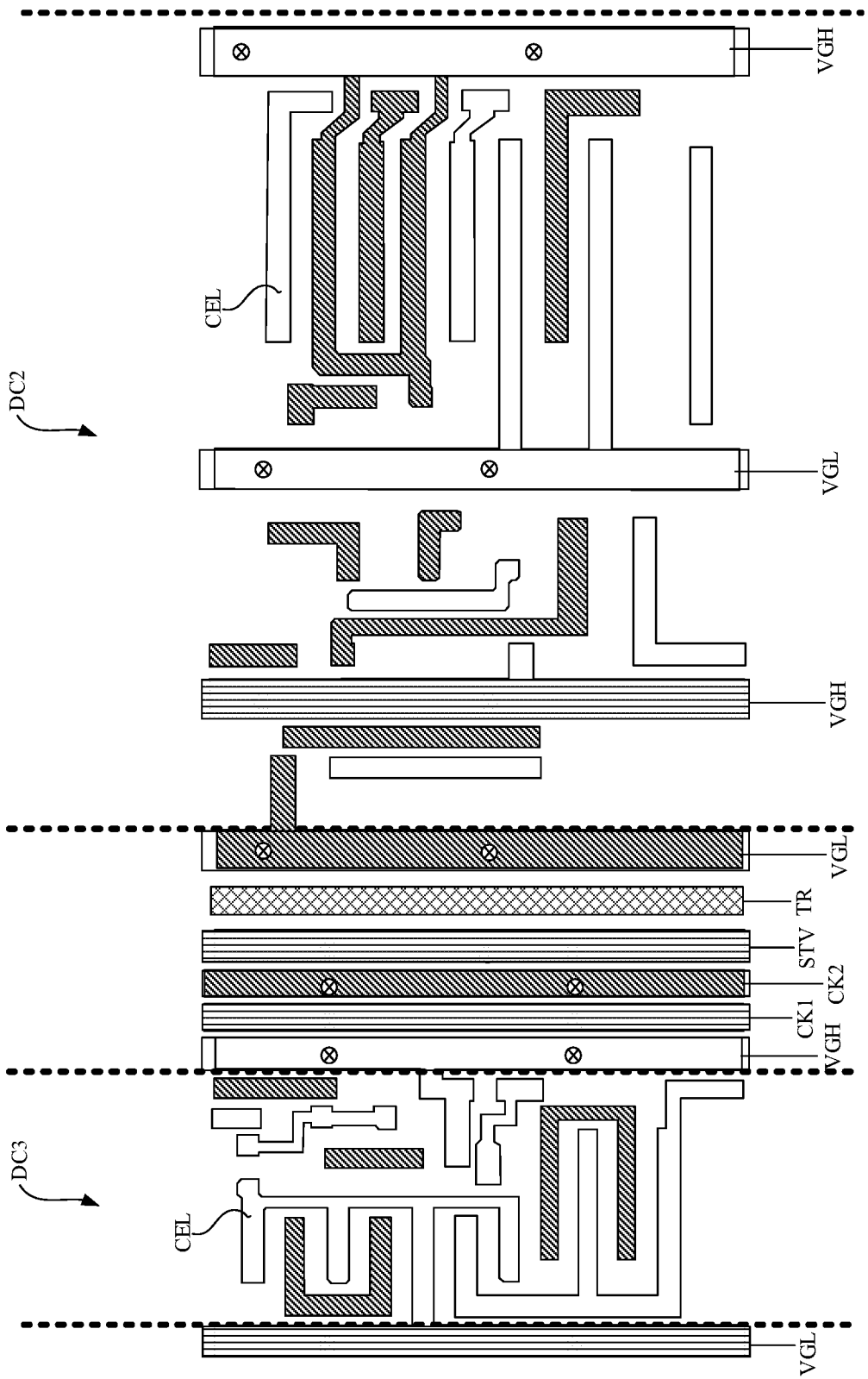
Figure 17O:
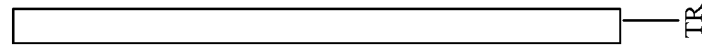

FIGS. 17A to 17O are layouts of partial areas and layouts of respective film layers on a second gate driving circuit and a light emitting control driving circuit when a driving module is shown in FIG. 16C. As shown in FIGS. 17A to 17O, the shift registers in the second gate driving circuit DC2 and the light emitting control driving circuit DC3 all use the circuit structure of 10T3C (10 transistors T21 to T30 and 3 capacitors C4 to C6) shown in FIG. 14.

The first clock signal line CK1, the second clock signal line CK2 and the frame starting signal line STV, which are shared by the second gate driving circuit DC2 and the light emitting control driving circuit DC3, are all located in an area between the second gate driving circuit DC2 and the light emitting control driving circuit DC3.

The display substrate includes: a base substrate, and an active layer LY1, a gate insulating layer, a first conductive layer LY2, a first insulating layer, a second conductive layer LY3, a second insulating layer LY4, a third conductive layer LY5, a planarization layer LY6, a fourth conductive layer LY7, and a pixel defining layer LY8 which are sequentially disposed along a direction away from the base substrate. The gate insulating layer and the first insulating layer are laid in a whole layer.

FIG. 17A schematically shows a case where the active layer LY1, the first conductive layer LY2, the second conductive layer LY3, the second insulating layer LY4, the third conductive layer LY5, the planarization layer LY6, the fourth conductive layer LY7, and the pixel defining layer LY8 are stacked, and schematically shows positions of transistors (T21 to T30), capacitors (C4 to C6) in the shift registers of the second gate driving circuit DC2 and the light emitting control driving circuit DC3, and positions of signal lines (the first clock signal line CK1, the second clock signal line CK2, the frame starting signal line STV, the high level voltage signal line VGH, and the low level voltage signal line VGL) provided for the shift registers.

FIG. 17B illustrates a layout of the active layer LY1, in which the active layer LY1 includes an active semiconductor area pattern and a source-drain conductive area pattern of each transistor. FIG. 17C illustrates a layout of the first conductive layer LY2, in which the first conductive layer LY2 includes a pattern of the gate electrodes of the transistors T21 to T30 and a pattern of one terminal of each of the capacitors C4 to C6. FIG. 17D illustrates a layout when the active layer LY1 and the first conductive layer LY2 are stacked. FIG. 17E illustrates a layout of the second conductive layer LY3, where the second conductive layer LY3 includes a pattern of the other terminal of each of the capacitors C4 to C6 and the output terminals OUT of the shift registers. FIG. 17F illustrates a case where the active layer LY1, the first conductive layer LY2, and the second conductive layer LY3 are stacked. FIG. 17G illustrates a layout of the second insulating layer LY4, in which a distribution of vias in the second insulating layer LY4 is shown. FIG. 17H illustrates a layout when the active layer LY1, the first conductive layer LY2, the second conductive layer LY3, and the second insulating layer LY4 are stacked. FIG. 17I illustrates a layout of the third conductive layer LY5, where the third conductive layer LY5 includes a pattern of the first clock signal line CK1, the second clock signal line CK2, the frame starting signal line STV, the high level voltage signal line VGH, and the low level voltage signal line VGL, and conductive connection lines CEL for circuit connection. FIG. 17J illustrates a layout when the active layer LY1, the first conductive layer LY2, the second conductive layer LY3, the second insulating layer LY4, and the third conductive layer LY5 are stacked. FIG. 17K illustrates a layout of the planarization layer LY6, where the planarization layer LY6 is provided with not only connection vias penetrating through the planarization layer, but also a blocking groove TR that effectively prevents the moisture from entering the display area. FIG. 17L illustrates a layout when the active layer LY1, the first conductive layer LY2, the second conductive layer LY3, the second insulating layer LY4, the third conductive layer LY5, and the planarization layer LY6 are stacked. FIG. 17M illustrates a layout of the fourth conductive layer LY7, where the fourth conductive layer LY7 includes signal lines CK1r, CK2r, STVr, VGHr, and VGLr that are in one-to-one correspondence with the first clock signal line CK1, the second clock signal line CK2, the frame starting signal line STV, the high level voltage signal line VGH, and the low level voltage signal line VGL in the third conductive layer LY5, and the signal lines CK1r, CK2r, STVr, VGHr, and VGLr in the fourth conductive layer LY7 are connected in parallel to the corresponding CK1, CK2, STV, VGH, and VGL in the third conductive layer LY5, respectively, so that equivalent resistances of the first clock signal line CK1, the second clock signal line CK2, the frame starting signal line STV, the high level voltage signal line VGH, and the low level voltage signal line VGL are reduced. FIG. 17N illustrates a layout when the third conductive layer LY5, the planarization layer LY6, and the fourth conductive layer LY7 are stacked. FIG. 17O illustrates a layout of the pixel defining layer LY8, where the pixel defining layer LY8 is also provided with a blocking groove TR for preventing the moisture from entering the display area.

Figure 18:
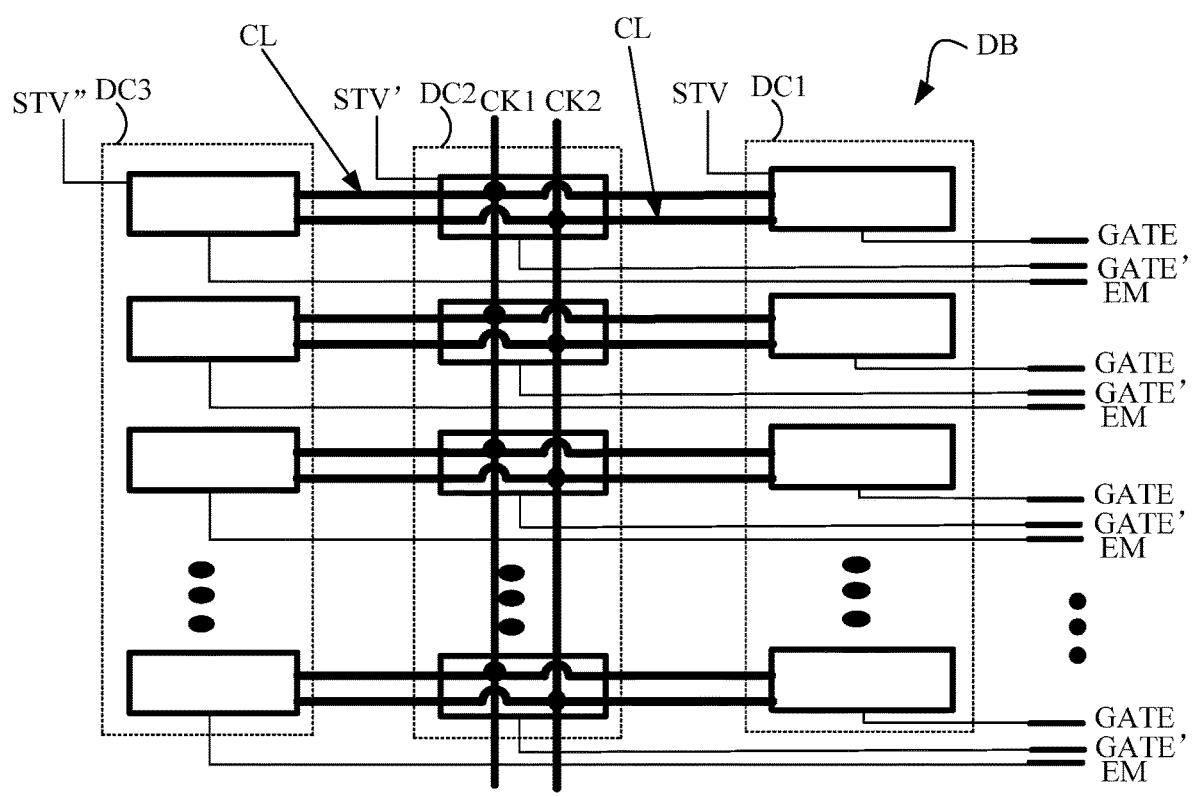
FIG. 18 is a schematic diagram of still another structure of a driving module in FIG. 3.

FIG. 18 is a schematic diagram of still another structure of a driving module in FIG. 3. As shown in FIG. 18, in some embodiments, the first clock signal line provided for the first gate driving circuit DC1, the second gate driving circuit DC2 and the light emitting control driving circuit DC3 is the same first clock signal line CK1, and the second clock signal line provided for the first gate driving circuit DC1, the second gate driving circuit DC2 and the light emitting control driving circuit DC3 is the same second clock signal line CK2. At this time, it is necessary to provide only one first clock signal line CK1 and only one second clock signal line CK2 for such the three driving circuits, so that the total number of clock signal lines required to be provided for the entire driving module DB is minimized, which is beneficial to realizing a narrow frame.

In the present embodiment, the driving circuits DC1, DC2, DC3 are provided with different frame starting signal lines STV, STV', STV".

In some embodiments, the first clock signal line CK1 shared by the first gate driving circuit DC1, the second gate driving circuit DC2, and the light emitting control driving circuit DC3 is located in an area where the second gate driving circuit DC2 is located; the second clock signal line CK2 shared by the first gate driving circuit DC1, the second gate driving circuit DC2, and the light emitting control driving circuit DC3 is located in the area where the second gate driving circuit DC2 is located. That is, the clock signal lines are not provided in the area between the first gate driving circuit DC1 and the second gate driving circuit DC2 and the area between the second gate driving circuit DC2 and the light emitting control driving circuit DC3.

In the technical solution shown in FIG. 18, when the first clock signal line CK1 and the second clock signal line CK2 are shared in the area where the second gate driving circuit DC2 is located, distances from the first clock signal line CK1 to the driving circuits can be effectively balanced, and uniformity and balance of the electrical properties can be realized. Alternatively, the first clock signal line CK1 and/or the second clock signal line CK2 shared by the three driving circuits may be placed in an area between the first gate driving circuit DC1 and the second gate driving circuit DC2, or in an area between the second gate driving circuit DC2 and the light emitting control driving circuit DC3 as necessary, which also fall within the scope of the present disclosure.

Referring to FIG. 18, in some embodiments, the pixel units are provided with corresponding data lines, and the first clock signal lines CK1 and CK1' and the second clock signal lines CK2 and CK2' are disposed in the same layer as the data lines DATA; the first clock signal lines CK1 and CK1' and the second clock signal lines CK2 and CK2' are connected to the corresponding driving circuits DC1, DC2 and DC3 through the corresponding connecting traces CL; the first clock signal lines CK1, CK1' and the second clock signal lines CK2, CK2' all extend along a first direction, the connecting traces CL extend along a second direction, and the first direction intersects with the second direction.

In some embodiments, the light emitting device OLED is located on a side of a layer, where the data lines are located, away from the base substrate; the light emitting device OLED includes a first electrode, a light emitting layer and a second electrode which are sequentially arranged along the direction away from the substrate, and the connecting traces CL and the first electrode are arranged in the same layer.

In some embodiments, the display substrate includes: a base substrate, and an active layer, a gate insulating layer, a first conductive layer, a first insulating layer, a second conductive layer, a second insulating layer, a third conductive layer, a planarization layer, a fourth conductive layer and a pixel defining layer which are sequentially arranged along the direction away from the base substrate, wherein a pixel accommodating hole is formed in the pixel defining layer, a light emitting layer is arranged in the pixel accommodating hole, and a fifth conductive layer is arranged on a side of the light emitting layer away from the base substrate.

The active layer includes patterns of the active layers and source-drain doped areas of the transistors in the display substrate; the first conductive layer includes gate electrodes of the transistors in the display substrate, the first gate lines GATE, the second gate lines GATE', the light emitting control signal lines EM and the first terminals of the capacitors; the second conductive layer includes a reset voltage transmission line (for providing the reset voltage provided by the reset power supply terminal to the pixel unit), and the second terminals of the capacitors; the third conductive layer includes the data lines, conductive traces used for electrically connecting electrical elements (such as transistors) in the pixel unit, the first clock signal lines, the second clock signal lines and the frame starting signal lines; the fourth conductive layer includes the first electrode and the connecting traces. The fifth conductive layer includes the second electrode.

The embodiment of the present disclosure further provides a display apparatus, which includes the display substrate in any one of the embodiments. It should be noted that the display apparatus provided in this embodiment may be: any product or component with a display function, such as a flexible wearable device, a mobile phone, a tablet computer, a television, a display, a notebook computer, a digital photo frame, a navigator or the like. Other essential components of the display apparatus are essential as understood by one of ordinary skill in the art, and are not described herein or should not be construed as limiting the disclosure.

Further, the display apparatus may also include various types of display apparatus, such as a liquid crystal display apparatus, an organic electroluminescence display apparatus (e.g., an OLED display apparatus, an QLED display apparatus), which is not limited.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising: a base substrate, wherein the base substrate comprises a display area and a peripheral area surrounding the display area; a plurality of pixel units are arranged in an array in the display area; a driving module is arranged in the peripheral area; and the driving module is configured to provide electrical signals for the plurality of pixel units, to control the plurality of pixel units to operate; the driving module comprises a plurality of driving circuits; each driving circuit is provided with a corresponding operating signal line group in the peripheral area; the operating signal line group comprises at least two operating signal lines, which are connected to the corresponding driving circuit, to provide electrical signals to the corresponding driving circuit; the at least two operating signal lines comprise a first clock signal line and a second clock signal line; first clock signal lines for at least two of the plurality of driving circuits are a same first clock signal line; and/or second clock signal lines provided for the at least two of the plurality of driving circuits are a same second clock signal line; and wherein all the pixel units are divided into a plurality of pixel unit groups, each of which is provided with a first gate line, a second gate line, and a light emitting control signal line corresponding to the pixel unit group to be connected to each pixel unit in the pixel unit group; the plurality of driving circuits comprise: a first gate driving circuit connected to the corresponding first gate line to provide a first gate driving signal to each pixel unit of the plurality of pixel units of the pixel unit group through the corresponding first gate line, a second gate driving circuit connected to the corresponding second gate line to provide a second gate driving signal to the same pixel unit through the corresponding second gate line, and a light emitting control driving circuit connected to the corresponding light emitting control signal line to provide a light emitting control signal to the same pixel unit through the corresponding light emitting control signal line; and first clock signal lines for at least two of the first gate driving circuit, the second gate driving circuit and the light emitting control driving circuit are a same first clock signal line and/or second clock signal lines for at least two of the first gate driving circuit, the second gate driving circuit and the light emitting control driving circuit are a same second clock signal line, wherein the first gate driving circuit, the second gate driving circuit, and the light emitting control driving circuit corresponding to the same pixel unit are sequentially arranged in a direction away from the display area along a first direction; and wherein the first clock signal lines for the second gate driving circuit and the light emitting control driving circuit are a same first clock signal line, and the second clock signal lines for the second gate driving circuit and the light emitting control driving circuit are a same second clock signal line; and the first clock signal line for the first gate driving circuit and the first clock signal line for the second gate driving circuit are two different first clock signal lines, and the second clock signal line for the first gate driving circuit and the second clock signal line for the second gate driving circuit are two different second clock signal lines.

2. The display substrate according to claim 1, wherein the first clock signal line shared by the second gate driving circuit and the light emitting control driving circuit is between the second gate driving circuit and the light emitting control driving circuit; and
the second clock signal line shared by the second gate driving circuit and the light emitting control driving circuit is between the second gate driving circuit and the light emitting control driving circuit.

3. The display substrate according to claim 1, wherein the first clock signal line and the second clock signal line for the first gate driving circuit are both between the first gate driving circuit and the second gate driving circuit.

4. The display substrate according to claim 1, wherein the pixel unit is provided with a corresponding data line, and the first clock signal line and the second clock signal line are in a same layer as the data line;
the first clock signal line and the second clock signal line are connected to the corresponding driving circuit through corresponding connecting traces; and
the first clock signal line and the second clock signal line extend along a first direction, the connection traces extend along a second direction, and the first direction intersects with the second direction.

5. The display substrate according to claim 1, wherein each pixel unit group is further provided with a corresponding first reset signal line; the pixel unit comprises: a pixel circuit and a light emitting device, the pixel circuit comprises: a first reset circuit, a writing and compensating circuit and a driving transistor; the first reset circuit is connected to a first reset power supply terminal, a control electrode of the driving transistor and the corresponding first reset signal line, and is configured to write a first reset voltage provided by the first reset power supply terminal to the control electrode of the driving transistor in response to control of the first reset signal line; the writing and compensating circuit is connected to a second operating voltage terminal, the control electrode of the driving transistor, a first electrode of the driving transistor, a corresponding data line, the corresponding first gate line, the corresponding second gate line, and the corresponding light emitting control signal line, and is configured to write a data compensation voltage to the control electrode of the driving transistor in response to control of the first gate line and the second gate line, wherein the data compensation voltage is equal to a sum of a data voltage provided by the data line and a threshold voltage of the driving transistor; a second electrode of the driving transistor is connected to a first terminal of the light emitting device, and the driving transistor is configured to output a corresponding driving current in response to control of the data compensation voltage; and a second terminal of the light emitting device is connected to a first operating voltage terminal.

6. The display substrate according to claim 5, wherein the first reset circuit comprises a first transistor, the writing and compensating circuit comprises a third transistor, a fourth transistor, and a fifth transistor;
a control electrode of the first transistor is connected to the first reset signal line, a first electrode of the first transistor is connected to the first reset power supply terminal, and a second electrode of the first transistor is connected to the control electrode of the driving transistor;
a control electrode of the third transistor is connected to the first gate line, a first electrode of the third transistor is connected to the data line, and a second electrode of the third transistor is connected to the first electrode of the driving transistor;
a control electrode of the fourth transistor is connected to the light emitting control signal line, a first electrode of the fourth transistor is connected to the second operating voltage terminal, and a second electrode of the fourth transistor is connected to the first electrode of the driving transistor;
a control electrode of the fifth transistor is connected to the second gate line, a first electrode of the fifth transistor is connected to the control electrode of the driving transistor, and a second electrode of the fifth transistor is connected to the second electrode of the driving transistor; and
wherein the third transistor and the fourth transistor are both P-type transistors, and the fifth transistor is an N-type transistor.

7. The display substrate according to claim 6, wherein the first transistor is an N-type transistor, the first reset signal line for the pixel unit group is the second gate line for m pixel unit groups before the pixel unit group, and m is a positive integer.

8. The display substrate according to claim 5, wherein the first reset circuit comprises a first transistor, and the writing and compensating circuit comprises a third transistor, a fourth transistor, a fifth transistor, and a seventh transistor;
a control electrode of the first transistor is connected to the first reset signal line, a first electrode of the first transistor is connected to the first reset power supply terminal, and a second electrode of the first transistor is connected to a first electrode of the fifth transistor and a second electrode of the seventh transistor;
a control electrode of the third transistor is connected to the first gate line, a first electrode of the third transistor is connected to the data line, and a second electrode of the third transistor is connected to the first electrode of the driving transistor;

a control electrode of the fourth transistor is connected to the light emitting control signal line, a first electrode of the fourth transistor is connected to the second operating voltage terminal, and a second electrode of the fourth transistor is connected to the first electrode of the driving transistor;

a control electrode of the fifth transistor is connected to the first gate line, and a second electrode of the fifth transistor is connected to the second electrode of the driving transistor;

a control electrode of the seventh transistor is connected to the second gate line, and a first electrode of the seventh transistor is connected to the control electrode of the driving transistor; and wherein the third transistor, the fourth transistor and the fifth transistor are all P-type transistors, and the seventh transistor is an N-type transistor.

9. The display substrate according to claim 8, wherein the first transistor is a P-type transistor, the first reset signal line for the pixel unit group is the first gate line for n pixel unit groups before the pixel unit group, and n is a positive integer.

10. The display substrate according to claim 5, wherein each pixel unit group is further provided with a corresponding second reset signal line; and the pixel circuit further comprises: a second transistor; a control electrode of the second transistor is connected to the corresponding second reset signal line, a first electrode of the second transistor is connected to a second reset power supply terminal, and a second electrode of the second transistor is connected to the first terminal of the light emitting device;

wherein the pixel circuit further comprises: a sixth transistor between the second electrode of the driving transistor and the first terminal of the light emitting device;

a control electrode of the sixth transistor is connected to the corresponding light emitting control signal line, a first electrode of the sixth transistor is connected to the second electrode of the driving transistor, and a second electrode of the sixth transistor is connected to the first terminal of the light emitting device.

11. The display substrate according to claim 10, wherein the second transistor is a P-type transistor, the second reset signal line for the pixel unit group is the first gate line for n pixel unit groups before the pixel unit group, and n is a positive integer; and the sixth transistor is a P-type transistor.

12. A display apparatus, comprising: the display substrate according to claim 1.

13. A display substrate, comprising: a base substrate, wherein the base substrate comprises a display area and a peripheral area surrounding the display area; a plurality of pixel units are arranged in an array in the display area; a driving module is arranged in the peripheral area; and the driving module is configured to provide electrical signals for the plurality of pixel units, to control the plurality of pixel units to operate; the driving module comprises a plurality of driving circuits; each driving circuit is provided with a corresponding operating signal line group in the peripheral area; the operating signal line group comprises at least two operating signal lines, which are connected to the corresponding driving circuit, to provide electrical signals to the corresponding driving circuit; the at least two operating signal lines comprise a first clock signal line and a second clock signal line; first clock signal lines for at least two of the plurality of driving circuits are a same first clock signal line; and/or second clock signal lines provided for the at least two of the plurality of driving circuits are a same second clock signal line, wherein pixel unit is provided with a corresponding data line, and the first clock signal line and the second clock signal line are in a same layer as the data line; the first clock signal line and the second clock signal line are connected to the corresponding driving circuit through corresponding connecting traces; and the first clock signal line and the second clock signal line extend along a first direction, the connection traces extend along a second direction, and the first direction intersects with the second direction; wherein the pixel unit comprises: a light emitting device on a side of a layer where the data line is located away from the base substrate; and the light emitting device comprises a first electrode, a light emitting layer and a second electrode sequentially arranged along a direction away from the base substrate, and the connecting traces and the first electrode are in a same layer.

14. A display apparatus, comprising: the display substrate according to claim 13.

15. A display substrate, comprising: a base substrate, wherein the base substrate comprises a display area and a peripheral area surrounding the display area; a plurality of pixel units are arranged in an array in the display area; a driving module is arranged in the peripheral area; and the driving module is configured to provide electrical signals for the plurality of pixel units, to control the plurality of pixel units to operate; the driving module comprises a plurality of driving circuits; each driving circuit is provided with a corresponding operating signal line group in the peripheral area; the operating signal line group comprises at least two operating signal lines, which are connected to the corresponding driving circuit, to provide electrical signals to the corresponding driving circuit; the at least two operating signal lines comprise a first clock signal line and a second clock signal line; first clock signal lines for at least two of the plurality of driving circuits are a same first clock signal line; and/or second clock signal lines provided for the at least two of the plurality of driving circuits are a same second clock signal line; wherein all the pixel units are divided into a plurality of pixel unit groups, each of which is provided with a first gate line, a second gate line, and a light emitting control signal line corresponding to the pixel unit group; and pixel units in each pixel unit group are connected to the first gate line, the second gate line, and the light emitting control signal line corresponding to the pixel units; the plurality of driving circuits comprise: a first gate driving circuit connected to the first gate line to provide a first gate driving signal to the pixel units through the first gate line, a second gate driving circuit connected to the second gate line to provide a second gate driving signal to the pixel units through the second gate line, and a light emitting control driving circuit connected to the light emitting control signal line to provide a light emitting control signal to the pixel units through the light emitting control signal line; and first clock signal lines for at least two of the first gate driving circuit, the second gate driving circuit and the light emitting control driving circuit are a same first clock signal line and/or second clock signal lines for at least two of the first gate driving circuit, the second gate driving circuit and the light emitting control driving circuit are a same second clock signal line; wherein each pixel unit group is further provided with a corresponding first reset signal line; a pixel unit comprises: a pixel circuit and a light emitting device, the pixel circuit comprises: a first reset circuit, a writing and compensating circuit and a driving transistor; the first reset circuit is connected to a first reset power supply terminal, a control electrode of the driving transistor and the corresponding first reset signal line, and is configured to write a first reset voltage provided by the first reset power supply terminal to the control electrode of the driving transistor in response to control of the first reset signal line; the writing and compensating circuit is connected to a second operating voltage terminal, the control electrode of the driving transistor, a first electrode of the driving transistor, a corresponding data line, the corresponding first gate line, the corresponding second gate line, and the corresponding light emitting control signal line, and is configured to write a data compensation voltage to the control electrode of the driving transistor in response to control of the first gate line and the second gate line, wherein the data compensation voltage is equal to a sum of a data voltage provided by the data line and a threshold voltage of the driving transistor; a second electrode of the driving transistor is connected to a first terminal of the light emitting device, and the driving transistor is configured to output a corresponding driving current in response to control of the data compensation voltage; and a second terminal of the light emitting device is connected to a first operating voltage terminal; wherein the first reset circuit comprises a first transistor, and the writing and compensating circuit comprises a third transistor, a fourth transistor, a fifth transistor, and a seventh transistor; a control electrode of the first transistor is connected to the first reset signal line, a first electrode of the first transistor is connected to the first reset power supply terminal, and a second electrode of the first transistor is connected to a first electrode of the fifth transistor and a second electrode of the seventh transistor; a control electrode of the third transistor is connected to the first gate line, a first electrode of the third transistor is connected to the data line, and a second electrode of the third transistor is connected to the first electrode of the driving transistor; a control electrode of the fourth transistor is connected to the light emitting control signal line, a first electrode of the fourth transistor is connected to the second operating voltage terminal, and a second electrode of the fourth transistor is connected to the first electrode of the driving transistor; a control electrode of the fifth transistor is connected to the first gate line, and a second electrode of the fifth transistor is connected to the second electrode of the driving transistor; a control electrode of the seventh transistor is connected to the second gate line, and a first electrode of the seventh transistor is connected to the control electrode of the driving transistor; and wherein the third transistor, the fourth transistor and the fifth transistor are all P-type transistors, and the seventh transistor is an N-type transistor; wherein the at least two operating signal lines further comprise a frame starting signal line; and frame starting signal lines for the second gate driving circuit and the light emitting control driving circuit are a same frame starting signal line.

16. The display substrate according to claim 15, wherein the frame starting signal line shared by the second gate driving circuit and the light emitting control driving circuit is between the second gate driving circuit and the light emitting control driving circuit.

\* \* \* \* \*